(12) United States Patent
Hersam et al.

(10) Patent No.: US 11,629,053 B2
(45) Date of Patent: Apr. 18, 2023

(54) OPTOELECTRONICALLY-ACTIVE TWO-DIMENSIONAL INDIUM SELENIDE AND RELATED LAYERED MATERIALS VIA SURFACTANT-FREE DEOXYGENATED CO-SOLVENT PROCESSING

(71) Applicant: NORTHWESTERN UNIVERSITY, Evanston, IL (US)

(72) Inventors: Mark C. Hersam, Wilmette, IL (US); Joohoon Kang, Evanston, IL (US)

(73) Assignee: NORTHWESTERN UNIVERSITY, Evanston, IL (US)

( * ) Notice: Subject to any disclaimer, the term of this patent is extended or adjusted under 35 U.S.C. 154(b) by 313 days.

(21) Appl. No.: 16/623,891

(22) PCT Filed: Jun. 28, 2018

(86) PCT No.: PCT/US2018/040083
§ 371 (c)(1),
(2) Date: Dec. 18, 2019

(87) PCT Pub. No.: WO2019/006160
PCT Pub. Date: Jan. 3, 2019

(65) Prior Publication Data
US 2021/0147235 A1 May 20, 2021

Related U.S. Application Data

(60) Provisional application No. 62/604,274, filed on Jun. 29, 2017.

(51) Int. Cl.
*C01B 9/00* (2006.01)
*C01B 19/00* (2006.01)
(Continued)

(52) U.S. Cl.
CPC .......... *C01B 19/007* (2013.01); *H01L 31/032* (2013.01); *H01L 31/035227* (2013.01);
(Continued)

(58) Field of Classification Search
None
See application file for complete search history.

(56) References Cited

U.S. PATENT DOCUMENTS 6,872,330 B2 * 3/2005 Mack ............... C01B 32/16
252/378 R
8,852,444 B2 * 10/2014 Green ............... C08G 81/00
210/624

(Continued)

FOREIGN PATENT DOCUMENTS

JP        2017052681 A  *  3/2017
WO   WO-2017013263 A1 *  1/2017 .......... C01B 19/007
WO   WO-2017089987 A1 *  6/2017 .......... B02C 19/06

OTHER PUBLICATIONS

Yuan et al., High efficiency shear exfoliation for producing high-quality, few-layered MoS2 nanosheets in a green ethanol/water system, RSC Adv. 6, pp. 82763-82762, Aug. 2016 (Year: 2016).*
JP-2017052681-A—English translation, Mar. 2017 (Year: 2017).*
Kang, J. et al. Solvent exfoliation of electronic-grade, two-dimensional black phosphorus, ACS Nano 9, 3596-3604 (2015).
(Continued)

*Primary Examiner* — Stefanie J Cohen
(74) *Attorney, Agent, or Firm* — Locke Lord LLP; Tim Tingkang Xia, Esq.

(57) ABSTRACT

Preparation of two-dimensional indium selenide, other two-dimensional materials and related compositions via surfactant-free deoxygenated co-solvent systems.

8 Claims, 31 Drawing Sheets

(51) Int. Cl.
   *H01L 31/032* (2006.01)
   *H01L 31/0352* (2006.01)
   *H01L 31/18* (2006.01)

(52) U.S. Cl.
   CPC .......... *H01L 31/18* (2013.01); *C01P 2002/72* (2013.01); *C01P 2002/77* (2013.01); *C01P 2002/82* (2013.01); *C01P 2002/85* (2013.01); *C01P 2004/04* (2013.01); *C01P 2004/24* (2013.01); *C01P 2006/40* (2013.01)

(56) References Cited

U.S. PATENT DOCUMENTS

| | | | | |
|---|---|---|---|---|
| 9,221,064 | B2* | 12/2015 | Hersam | B03D 3/00 |
| 10,442,875 | B2* | 10/2019 | Dinca | B01J 35/1028 |
| 2010/0196256 | A1 | 8/2010 | Wu et al. | |
| 2012/0205585 | A1* | 8/2012 | Okamura | C07D 217/04 |
| | | | | 252/301.16 |
| 2013/0323878 | A1* | 12/2013 | Curtis | H01L 31/0322 |
| | | | | 438/95 |
| 2016/0340533 | A1* | 11/2016 | Casiraghi | H01L 31/113 |
| 2017/0044683 | A1 | 2/2017 | Cullen et al. | |

OTHER PUBLICATIONS

Kang, J. et al. Stable aqueous dispersions of optically and electronically active phosphorene, Proc. Nat. Acad. Sci. 113, 11688-11693 (2016).
Sandurin, D.A. et al. High electron mobility, quantum hall effect and anomalous optical response in atomically thin Inse., Nat. Nanotechnol. 12, 223-227 (2017).
Zhou, K.G. et al. A mixed-solvent strategy for efficient exfoliation of inorganic graphene analogues, Angew. Chem. Int. Ed. 50, 10839-10842 (2011).
Cunningham, G. et al. Photoconductivity of solution-processed $MoS_2$ films, J. Mater. Chem. C1, 6899-6904 (2013).
Korean Intellectual Property Office (ISR/KR), "International Search Report for PCT/US2018/040083", Korea, dated Dec. 10, 2018.
Fan, Xiaobin et al., "Controlled Exfoliation of $MoS_2$ Crystal into Trilayer Nanosheets", JACS, 2016, vol. 138, No. 15, pp. 2143-2149.
Cunningham, Graeme et al., "Solvent Exfoliation of Transition Metal Dischalcogenides: Dispersibility of Exfoliated Nanosheets Varies Only Weakly between Compounds", ACS Nano, 2012, vol. 6, No. 4, pp. 3468-3480.
Harvey, Andrew et al., "Production of $Ni(OH)_2$ nanosheets by liquid phase exfoliation: from optical properties to electrochemical applications", J. Mater. Chem. A., 2016, vol. 4, pp. 11046-11059.

* cited by examiner

OPTOELECTRONICALLY-ACTIVE TWO-DIMENSIONAL INDIUM SELENIDE AND RELATED LAYERED MATERIALS VIA SURFACTANT-FREE DEOXYGENATED CO-SOLVENT PROCESSING

This application claims priority to and the benefit of application Ser. No. 62/604,274 filed Jun. 29, 2017—the entirety of which is incorporated herein by reference.

This invention was made with government support under DMR-1505849 awarded by the National Science Foundation. The government has certain rights in the invention.

BACKGROUND OF THE INVENTION

Layered InSe has attracted attention as an emerging 2D semiconductor due to its exceptional optical and electronic properties. Bulk InSe crystals possess a 1.3 eV direct bandgap and consist of in-plane covalently bonded Se—In—In—Se layers that interact out-of-plane via weak van der Waals bonding (FIG. 1A). When the thickness of InSe is decreased from the bulk to the atomically thin limit, the bandgap increases and exhibits a direct-to-indirect transition, as opposed to the indirect-to-direct transition of $MoS_2$. Additionally, InSe has a lighter electron effective mass ($m^*=0.143\ m_0$) and higher room-temperature carrier mobility (exceeding $10^3\ cm^2\ V^{-1}s^{-1}$) compared to transition metal dichalcogenides (TMD). Although these desirable optical and electronic properties make InSe a promising candidate for high-performance electronic and optoelectronic applications, chemical degradation of thin InSe nanosheets in ambient conditions presents processing challenges. One approach for mitigating chemical degradation is to isolate InSe nanosheets via micromechanical exfoliation in an inert atmosphere and then encapsulate them with hexagonal boron nitride.

While micromechanical exfoliation is suitable for research prototyping, this method has limited scalability. Alternative schemes for producing 2D InSe include pulsed laser deposition or chemical synthesis from solution. However, the quality of the resulting 2D InSe from these approaches has been inferior to InSe nanosheets isolated via micromechanical exfoliation. In contrast, liquid-phase exfoliation (LPE) has been previously demonstrated as a viable route for the scalable production of a variety of 2D nanomaterials. Previous LPE studies have found that the choice of solvent is critical for efficient solvent exfoliation, with high boiling point (~200° C.) N-methyl-2-pyrrolidone (NMP) or dimethylformamide (DMF) working particularly well due to their surface tensions ($\gamma=\sim40\ mJ\ m^{-2}$) matching well with most 2D nanomaterials. Alternatively, amphiphilic surfactants have enabled LPE and stabilization of 2D nanomaterials in aqueous colloidal suspensions. However, high boiling point solvents and aqueous surfactant solutions result in residual chemical degradation and/or surface contamination that requires post-processing (e.g., annealing) in an effort to recover electronic and optical properties.

SUMMARY OF THE INVENTION

In light of the foregoing, it is an object of the present invention to provide methods relating to the preparation of two-dimensional indium selenide, other few-layer materials and related compositions, thereby overcoming various deficiencies and shortcomings of the prior art, including those outlined above. It will be understood by those skilled in the art that one or more aspects of this invention can meet certain objectives, while one or more aspects can meet certain other objectives. Each objective may not apply equally, in all its respects, to every aspect of this invention. As such, the following objects can be viewed in the alternative, with respect to any one aspect of this invention.

It can be an object of the present invention to provide one or more methods of preparing two-dimensional indium selenide and other few-layer nanomaterials in such a way as to preserve desirable optical and electronic properties.

It can be another object of the present invention to provide a method for preparation of two-dimensional indium selenide without resorting to surfactants and/or high-boiling point solvents of the prior art.

It can be another object of the present invention, alone or in conjunction with one or more of the preceding objectives, to provide such a method scalable for the production of ultra-high performance indium selenide optoelectric devices.

Other objects, features, benefits and advantages of the present invention will be apparent from this summary and the following descriptions of certain embodiments, and will be readily apparent to those skilled in the art having knowledge of various indium selenide and other few-layer nanomaterial preparation methods and the fabrication of related device structures. Such objects, features, benefits and advantages will be apparent from the above as taken in conjunction with the accompanying examples, data, figures and all reasonable inferences to be drawn therefrom.

In part, the present invention can provide a method of preparing few-layer indium selenide. Such a method can comprise providing a composition comprising bulk indium selenide and a deoxygenated fluid medium comprising at least two fluid components of the sort discussed elsewhere herein; sonicating such a composition to provide such a medium comprising exfoliated indium selenide nanomaterials; and centrifuging such a medium to provide a supernatant component comprising at least one of mono-, bi- and n-layer few-layer indium selenide nanosheets dispersed therein, where n can be an integer selected from 3-about 6. In certain embodiments, such a fluid medium can comprise ethanol and water. In certain such embodiments, such a medium can be about 60:40 (v/v) ethanol:water. Regardless, the speed and/or rate of centrifugation can selectively provide indium selenide nanosheets of a thickness dimension.

In part, the present invention can also provide a method of preparing few-layer indium selenide. Such a method can comprise providing a composition comprising bulk crystalline indium selenide and a deoxygenated co-solvent system comprising at least two solvent components; sonicating such a composition to provide such a medium comprising exfoliated indium selenide nanomaterials; and centrifuging such a medium to provide a supernatant component comprising at least one of mono-, bi- and n-layer few-layer indium selenide nanosheets dispersed therein, where n can be an integer selected from 3-about 6. In certain embodiments, such a co-solvent system can comprise ethanol and water. In certain such embodiments, such a system can be about 60:40 (v/v) ethanol:water. Regardless, the speed/rate of centrifugation can selectively provide indium selenide nanosheets of a thickness dimension. Without limitation, such indium selenide nanosheets can be incorporated into a single nanosheet device, or alternatively, a thin-film device. As discussed elsewhere herein, such a method can be used to provide other few-layer nanomaterials such as but not limited to few-layer TMDs and black phosphorus.

In part, the present invention can also provide a method of preparing a few-layer nanomaterial. Such a method can comprise providing a composition comprising a bulk layered material exfoliatable into a few-layer material, and a deoxygenated co-solvent system comprising at least two solvents; sonicating such a composition to provide such a system comprising exfoliated nanomaterials; and centrifuging such a system to provide a supernatant component comprising at least one of mono-, bi- and n-layer few-layer nanosheets of such a material dispersed therein, where n can be an integer selected from 3-about 6. Without limitation, such a bulk layered material can be selected from transition metal dichalcogenides, Group III monochalcogenides, Group IV monochalcogenides, hexagonal boron nitride, graphene and black phosphorus. In certain such embodiments, such a transition metal dichalcogenide can be selected from $MoS_2$, $MoSe_2$, $MoTe_2$, $WS_2$ and $WSe_2$. In certain other embodiments, such a Group III monochalcogenide can be indium selenide. Regardless, such a co-solvent system can comprise solvent components providing a combined surface tension sufficient to at least partially disperse such few-layer nanosheets therein. In certain non-limiting embodiments, such a co-solvent system can comprise ethanol and water. In certain such embodiments, such a co-solvent system can be about 60:40 (v/v) ethanol:water.

In part, the present invention can also provide a method of using a co-solvent system to prepare few-layer indium selenide. Such a method can comprise providing a composition comprising bulk crystalline indium selenide and a deoxygenated co-solvent system comprising at least two solvents; sonicating such a composition to provide such a co-solvent system comprising exfoliated indium selenide nanomaterials; and centrifuging such a system to provide a supernatant component comprising at least one of mono-, bi- and n-layer few-layer indium selenide nanosheets dispersed therein, where n can be an integer selected from 3-about 6, wherein such solvent components can provide a combined surface tension or energy at least partially sufficient to at least partially disperse indium selenide nanosheets therein. Without limitation, such a co-solvent system can comprise water and a low-boiling point solvent miscible with water. In certain embodiments, such a co-solvent system can comprise ethanol and water. In certain such embodiments, such a system can be about 60:40 (v/v) ethanol:water. Regardless, the speed/rate of centrifugation can selectively provide indium selenide nanosheets of a thickness dimension. As discussed elsewhere herein, such a co-solvent system can be used to prepare various other nanomaterials, such as few-layer TMDs and black phosphorus.

In part, the present invention can also be directed to a composition comprising a few-layer nanomaterial comprising at least one of mono-, bi- and n-layer few-layer nanosheets of such a nanomaterial, where n can be an integer selected from 3-about 6; and a deoxygenated medium comprising ethanol and water. In certain non-limiting embodiments, such a nanomaterial can be selected from transition metal dichalcogenides, black phosphorus and indium selenide. Regardless, such a composition can be substantially absent a surfactant.

DETAILED DESCRIPTION OF CERTAIN EMBODIMENTS

As relates to certain non-limiting embodiments of this invention, the present invention provides LPE of InSe in a surfactant-free, low boiling point, deoxygenated co-solvent system. The resulting 2D InSe flakes and thin films possess minimal processing residues and are structurally and chemically pristine. Individual LPE InSe nanosheets exhibit a maximum photoresponsivity of ~$10^7$ A $W^{-1}$, which is the highest value of any 2D nanomaterial to date. Furthermore, the surfactant-free co-solvent system not only stabilizes the InSe dispersion by controlling solvent surface energy but also promotes the assembly of electronically percolating InSe flake arrays without post-treatment, enabling the production of ultrahigh performance thin-film photodetectors.

Figure 1A:
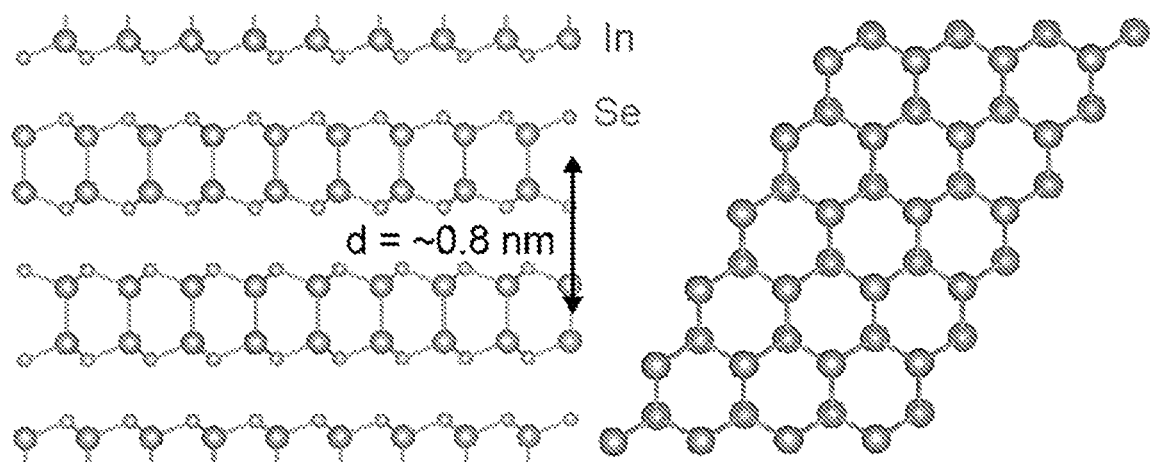
FIGS. 1A-C. Preparation of InSe dispersions. A, Schematic of the layered InSe crystal structure. Larger and smaller balls indicate indium and selenium atoms, respectively. B, Schematic of the preparation process, in an inert atmosphere, for surfactant-free InSe dispersions. Deoxygenated ethanol/water mixture was prepared by ultrahigh-purity Ar purging. The InSe crystal was exfoliated in a sealed container using tip ultrasonication and centrifuged to remove unexfoliated InSe crystals. C, Concentrations of InSe dispersions vs. ethanol concentrations.
Figure 1B:
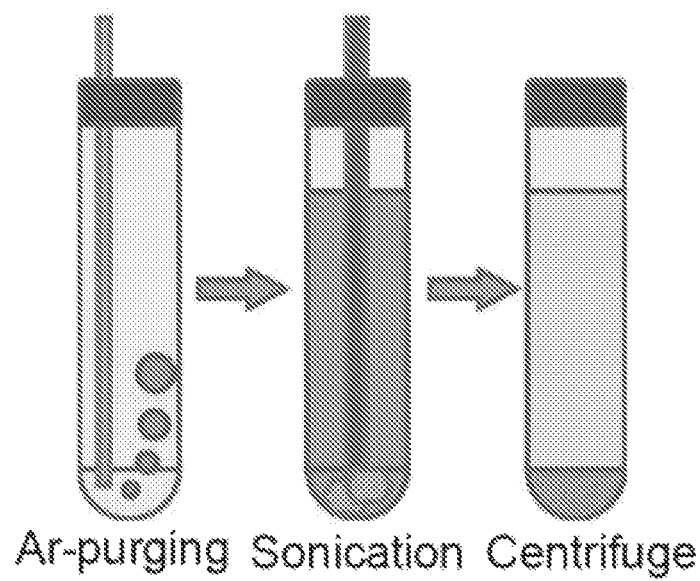

In certain such embodiments, InSe is exfoliated in a deoxygenated, low boiling point ethanol/water co-solvent system without further additives to minimize processing-related residues and chemical degradation. The original InSe crystal is grown by controlled solidification from a non-stoichiometric melt (FIG. 2). The InSe dispersion preparation comprises the following three steps: Ar-purging to prepare deoxygenated solvent, ultrasonication to exfoliate InSe, and centrifugation to sort by flake thickness (FIG. 1B). By employing a sealed tip ultrasonication system, InSe crystals are exfoliated in deoxygenated solvent in an inert atmosphere to avoid chemical degradation. The resulting exfoliated InSe nanosheets are stabilized by a mixture of water and ethanol, two solvents that individually are ineffective at dispersing 2D nanomaterials, but together have a surface energy that matches well with InSe when mixed at an appropriate ratio.

Figure 1C:
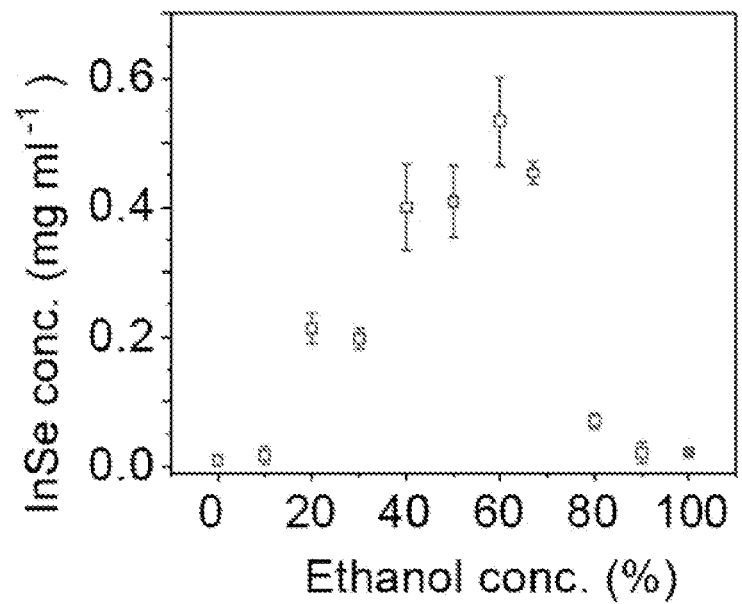
Figure 2A:
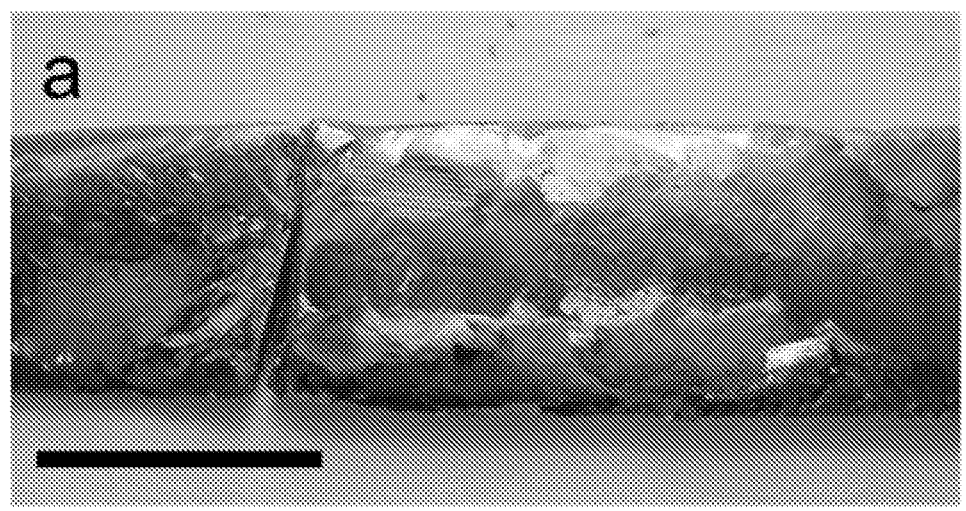
FIGS. 2A-D. InSe crystal growth and characterization. A, Digital image of an InSe ingot (scale bar=1 cm). B, X-ray diffraction indicates single-phase composition of InSe. C, Photoluminescence spectrum shows the PL peak at 995 nm corresponding to the band transition at 1.25 eV. D, Raman spectrum shows the presence of $E_{2g}$, $E_{1g}$, and $A^2_{1g}$ phonon modes that are consistent with $D_{6h}^4$ symmetry.
Figure 2B:
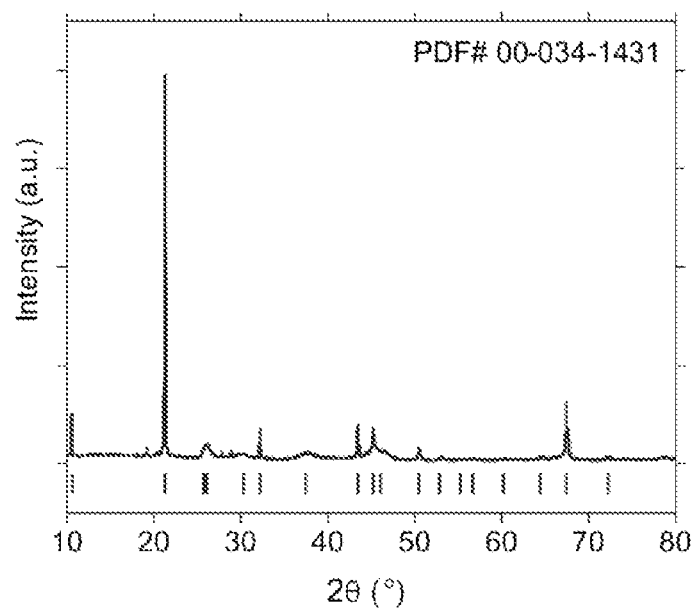
Figure 2C:
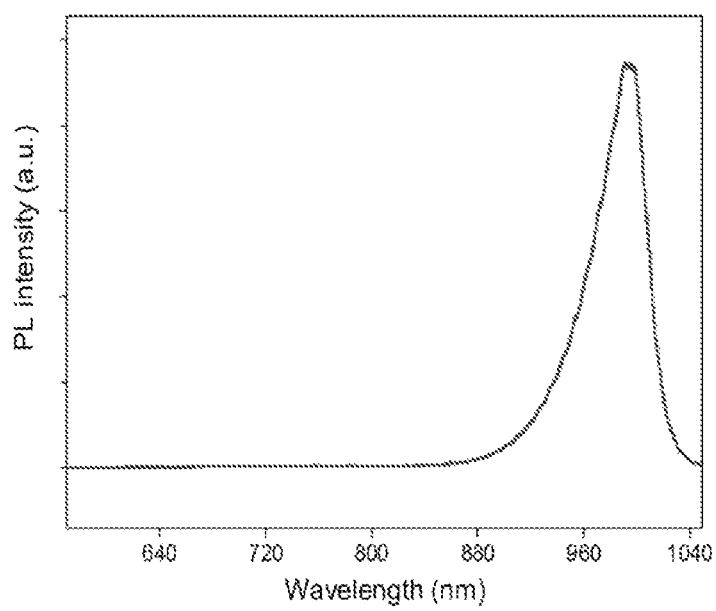
Figure 2D:
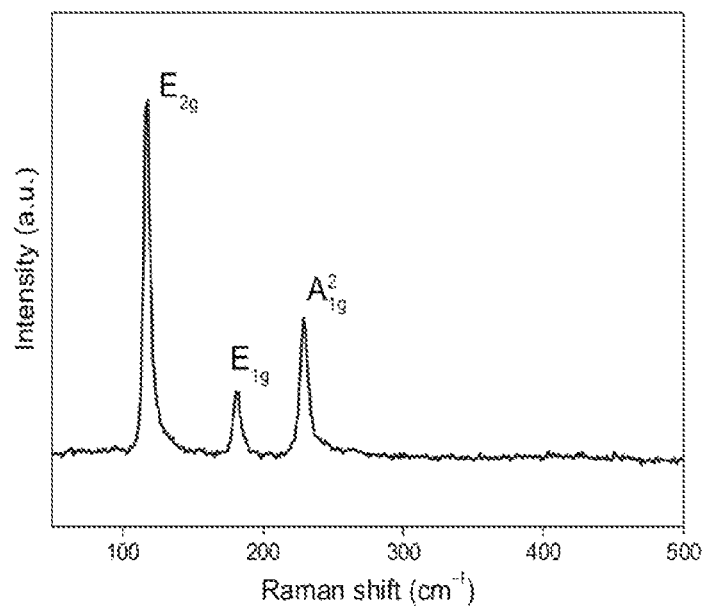
Figure 3:
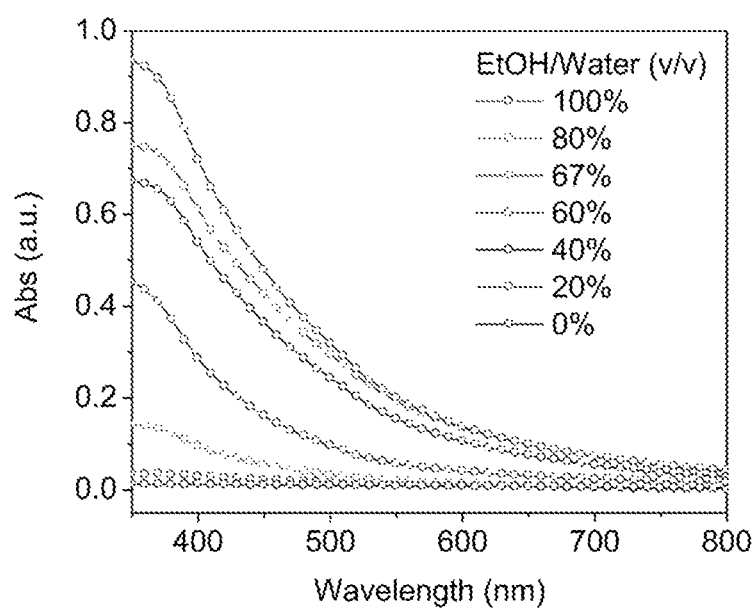
FIG. 3. Absorbance spectra of InSe dispersions. Absorbance spectra of InSe dispersions prepared with different ethanol/water concentrations.
Figure 4:
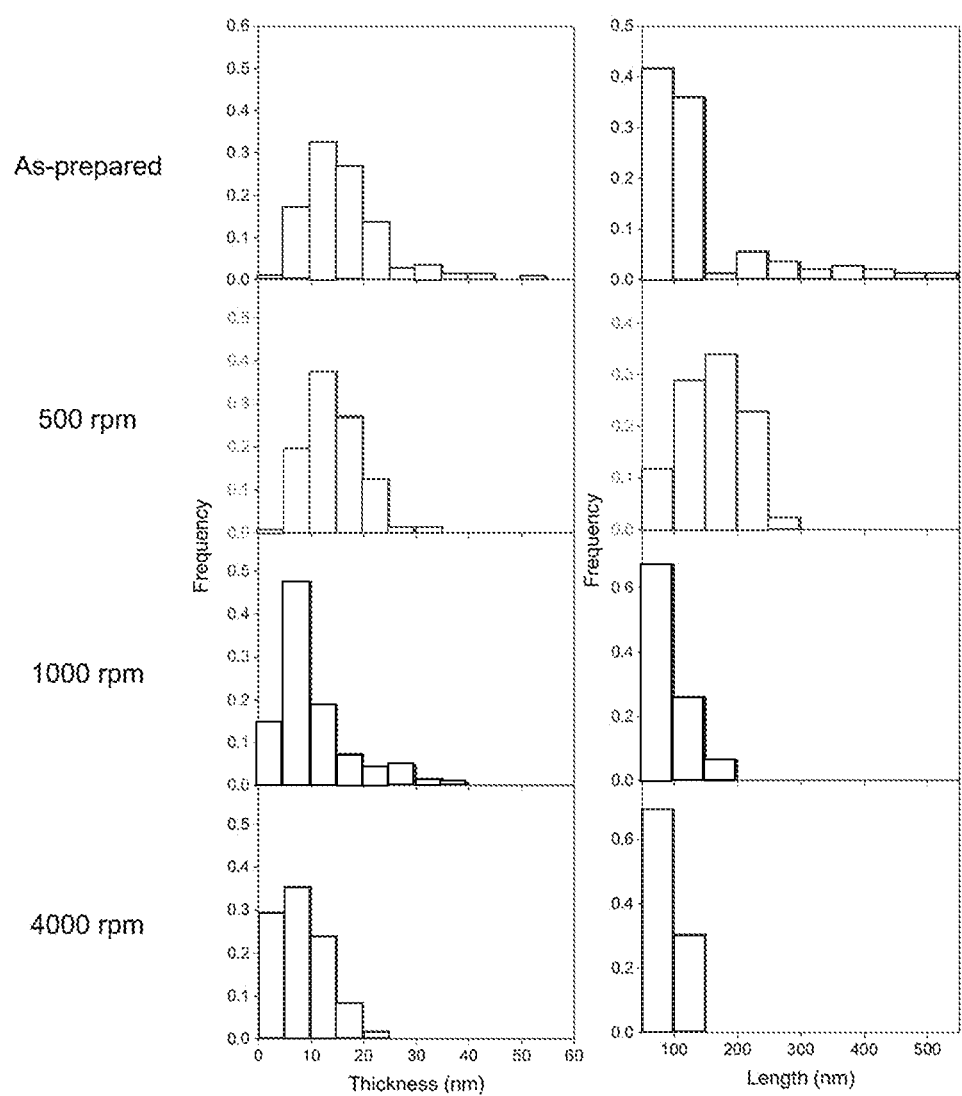
FIG. 4. Thickness and length distributions derived from atomic force microscopy (AFM) measurements. AFM images (image size: 2 microns×2 microns) of InSe nanosheets based on different centrifugation speeds (left). Thickness (center) and length (right) histograms obtained from AFM analysis.

To optimize the stability of the InSe nanosheet dispersions, samples were prepared using identical exfoliation procedures at different ethanol to water ratios. A mixture of two poor solvents, in this case ethanol ($\gamma=\sim22$ mJ $m^{-2}$) and water ($\gamma=\sim73$ mJ $m^{-2}$), can be combined to effectively disperse 2D nanomaterials because the overall surface energy of the solvent mixture is approximately a linear combination of its compositions. With reference to FIG. 1C, InSe crystals with an initial concentration of 1 mg $ml^{-1}$ were exfoliated in ethanol/water mixtures (0-100% ethanol) with different volume ratios and centrifuged to remove remaining aggregates: a co-solvent composition of 60% ethanol and 40% water provides the highest concentration InSe nanosheet dispersion. At this optimal condition, the concentration of InSe in the co-solvent mixture was measured to be ~0.55 mg $ml^{-1}$ compared to the negligible concentrations observed in pure ethanol or pure water as determined by extinction coefficient analysis (FIG. 3). Subsequent fine tuning of the thickness and lateral size of the InSe nanosheets is achieved using centrifugation (FIG. 4).

Figure 5A:
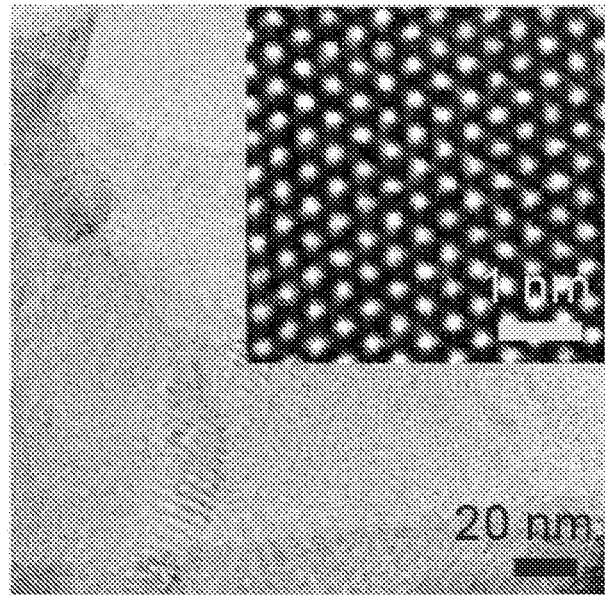
FIGS. 5A-F. Characterization of liquid-phase exfoliated InSe. A, Low-resolution TEM image of a representative InSe nanosheet along with a magnified high-resolution TEM image (inset). B, SAED pattern from an InSe nanosheet. C, Raman spectrum of InSe nanosheets with a 532 nm excitation wavelength. D, Solution-phase PL spectrum of InSe nanosheets using an excitation wavelength of 320 nm. E,F, XPS analysis of the InSe nanosheets.
Figure 5B:
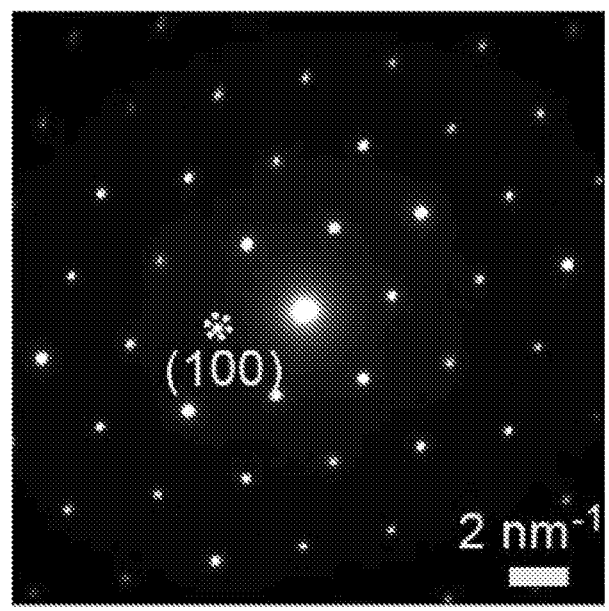
Figure 5C:
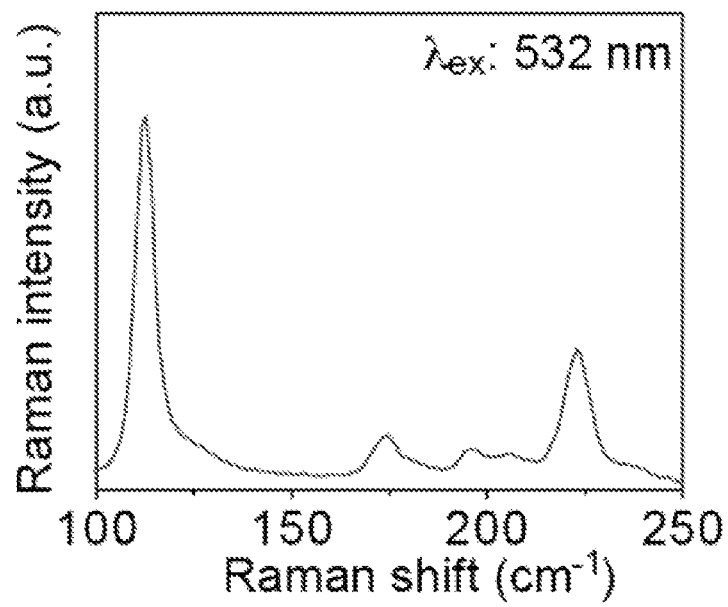
Figure 5D:
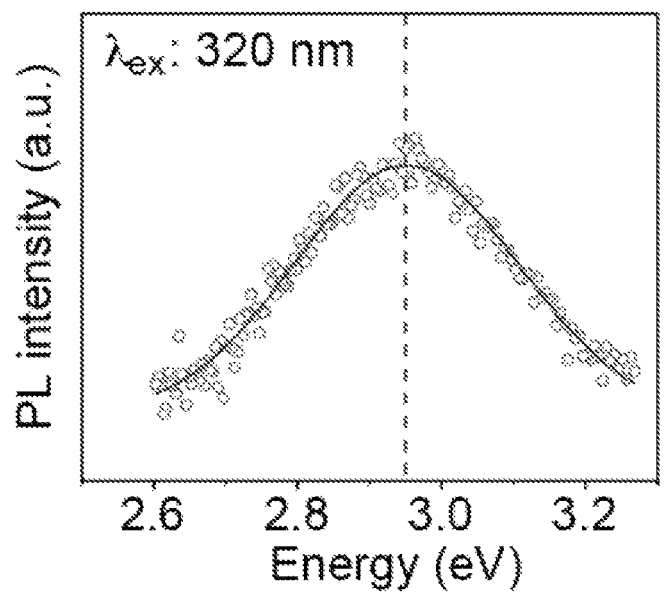
Figure 5E:
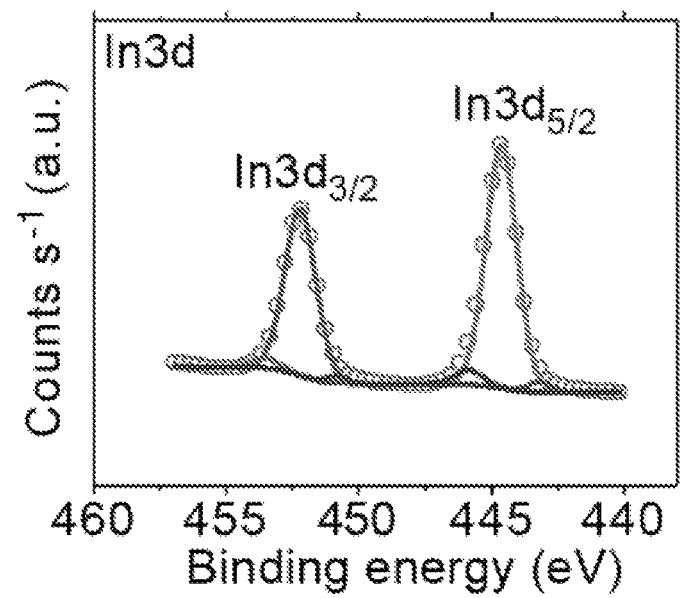
Figure 5F:
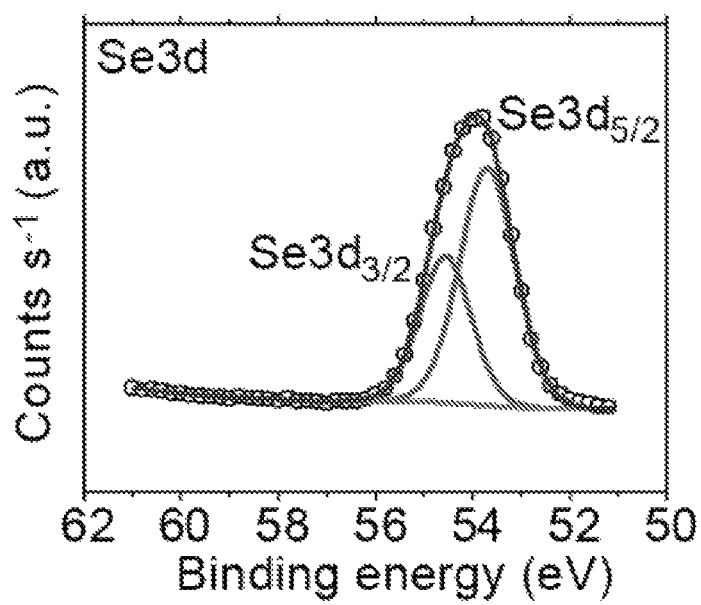
Figure 6:
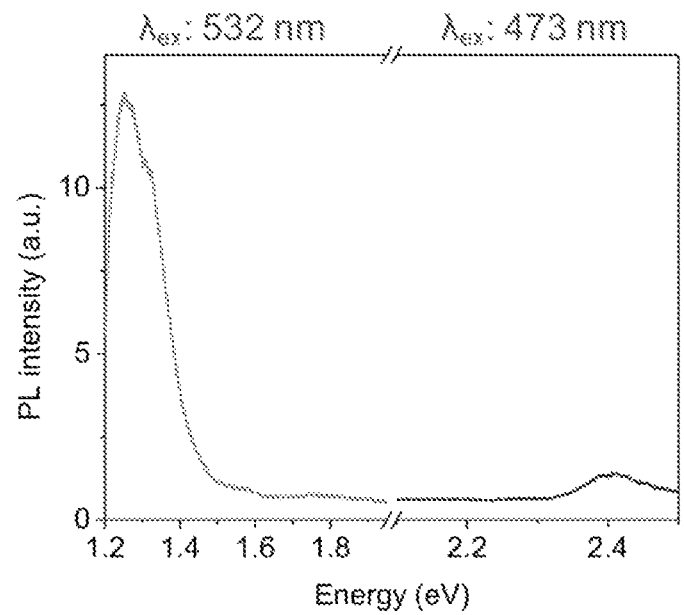
FIG. 6. Photoluminescence (PL) spectra of InSe nanosheets. PL spectra obtained from as-exfoliated InSe nanosheets at excitation wavelengths of 532 nm and 473 nm show PL peaks at both high energy (~2.4 eV) and low energy ranges (~1.25 to 1.8 eV correspond to PL from bulk to two-layer InSe).
Figure 7:
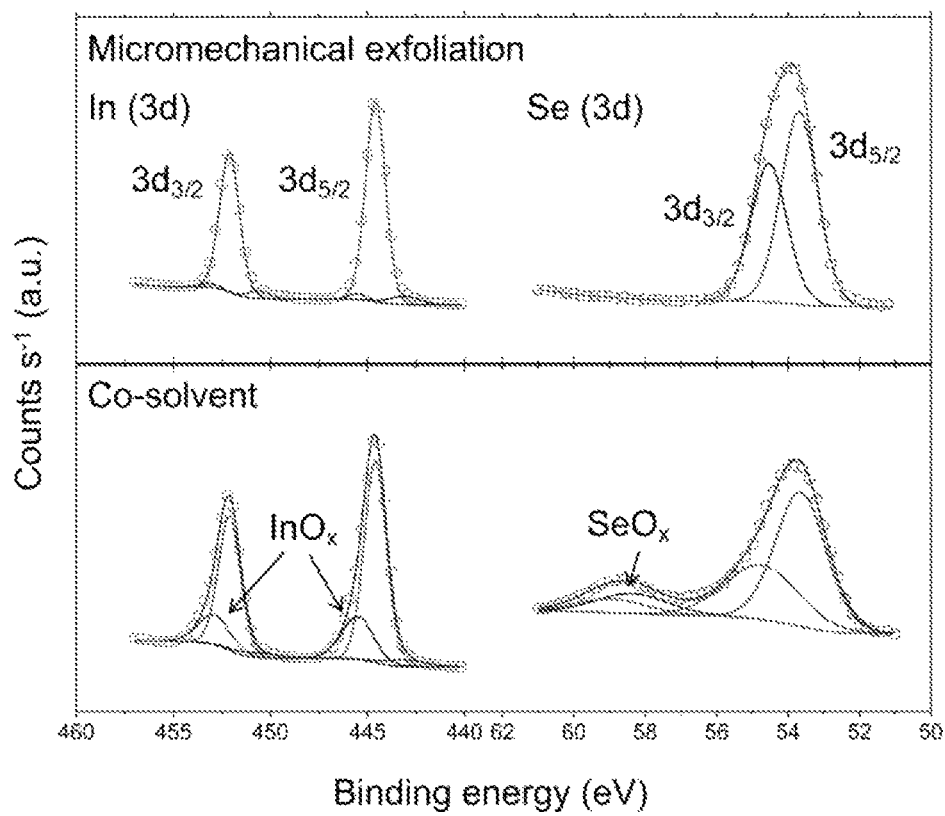
FIG. 7. X-ray photoelectron spectroscopy (XPS) analysis. XPS spectra of In3d and Se3d obtained from a micromechanically exfoliated InSe sample (top) and a solution-processed InSe sample without Ar purging (below). The sample processed without deoxygenated solvents shows InOx and SeOx peaks FIGS. 8A-F. Optoelectronic properties of isolated liquid-phase exfoliated InSe nanosheets. A, Optical image of a single InSe nanosheet FET with a higher-magnification atomic force microscopy image with thickness profile. B, Transfer curves for an InSe FET plotted on a semi-logarithmic scale (open squares) and a linear scale (lines) for $V_{DS}$ values of 1 V, 0.1 V, and 0.01 V. C,D, Photocurrent ($I_{pc}$) and responsivity measured with various light powers at $V_{DS}$=1 V. E, Responsivity plotted as a function of laser power density with gate voltage ($V_{GS}$) variations at $V_{DS}$=1 V. F, Plot of responsivity versus rise time that compares this work to previously reported 2D nanomaterial photodetectors.

The resulting 2D InSe nanosheets were characterized with a comprehensive suite of microscopy and spectroscopy techniques including transmission electron microscopy (TEM), selective area electron diffraction (SAED), Raman spectroscopy, photoluminescence (PL), and X-ray photoelectron spectroscopy (XPS). In FIG. 5A-B, a representative TEM image and the magnified high-resolution TEM (HR-TEM) image coupled with the corresponding sharp SAED pattern provide strong evidence that the InSe nanosheets maintain their crystalline structure after processing. This conclusion is corroborated by Raman spectroscopy, as shown in FIG. 5C. The Raman spectrum shows six distinct vibrational modes at ~115 $cm^{-1}$, ~174 $cm^{-1}$, ~180 $cm^{-1}$, ~198 $cm^{-1}$, ~208 $cm^{-1}$, and ~225 $cm^{-1}$, which correspond to the $A_1^1$, $E^1$-TO, $A_2^2$-TO, $A_2^2$-LO, $E^1$-LO, and $A_1^1$ phonon modes, respectively. Additionally, solution-phase PL measurements show an emission peak at ~2.95 eV for an excitation wavelength of 320 nm, which is consistent with previous reports of monolayer InSe PL emission (PL spectra at additional excitation wavelengths that provide evidence for few-layer InSe are provided in FIG. 6). Furthermore, FIG. 5E-F shows XPS for exfoliated InSe nanosheets prepared in an Ar-purged co-solvent mixture, which reveals $In3d_{3/2}$, $In3d_{5/2}$, $Se3d_{3/2}$, $Se3d_{5/2}$ peaks at 452.2 eV, 444.7 eV, 54.5 eV and 53.6 eV, respectively. These peaks are characteristic of pristine crystalline InSe, thus confirming that LPE in deoxygenated co-solvent mixtures minimize chemical degradation. In contrast, XPS taken on InSe nanosheets prepared without Ar-purging of the co-solvent mixture exhibits InOx and SeOx peaks, which are indicative of deleterious oxidation during processing (FIG. 7).

Figure 8A:
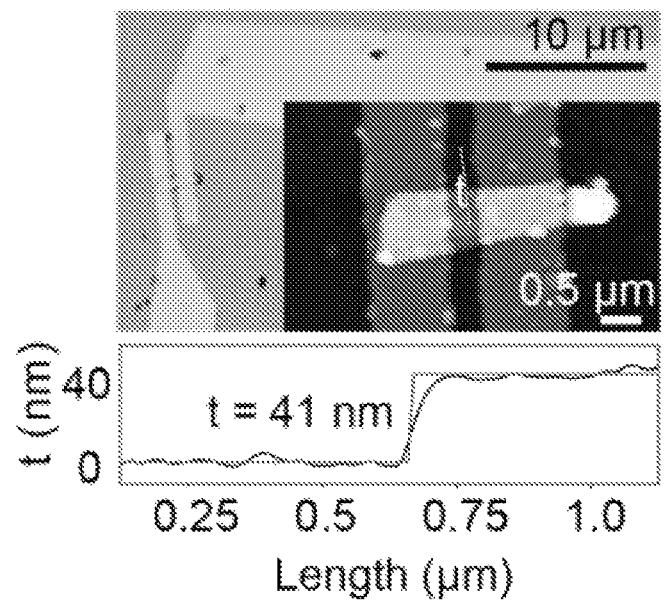
Figure 8B:
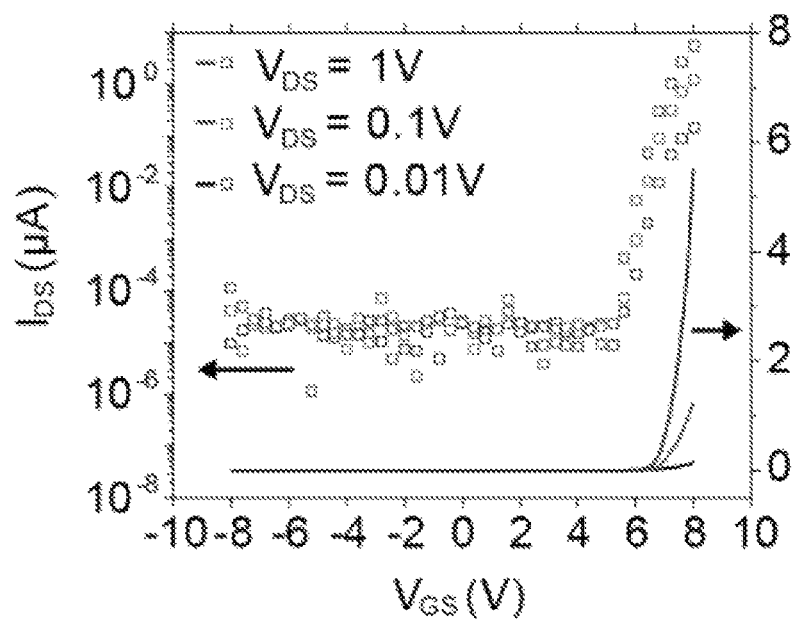

The optoelectronic properties of individual 2D InSe nanosheets were explored by fabricating field-effect transistors (FETs) by electron-beam lithography. FIG. 8A shows an optical microscopy image of a LPE InSe nanosheet deposited on a 20 nm $Al_2O_3$ substrate that provides strong capacitive coupling to the FET channel. The nanosheet thickness was measured to be ~41 nm by atomic force microscopy, while the channel length and width are 400 nm and 800 nm, respectively. In FIG. 8B, transfer curves reveal a current modulation ($I_{on}/I_{off}$ ratio) of ~$10^6$ and field-effect mobility of ~19 $cm^2 V^{-1} S^{-1}$ at a drain bias $V_{DS}$ of 1 V, which agrees well with values previously reported for micromechanically exfoliated InSe supported on oxide dielectrics.

Figure 8C:
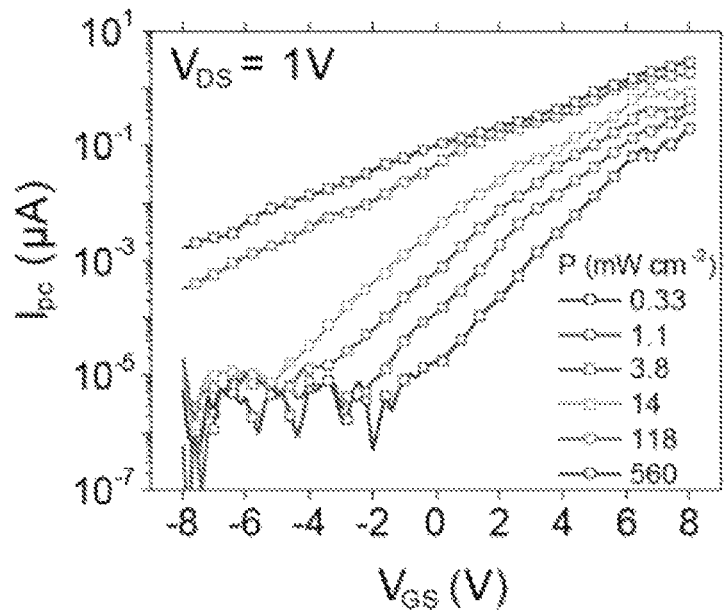
Figure 8D:
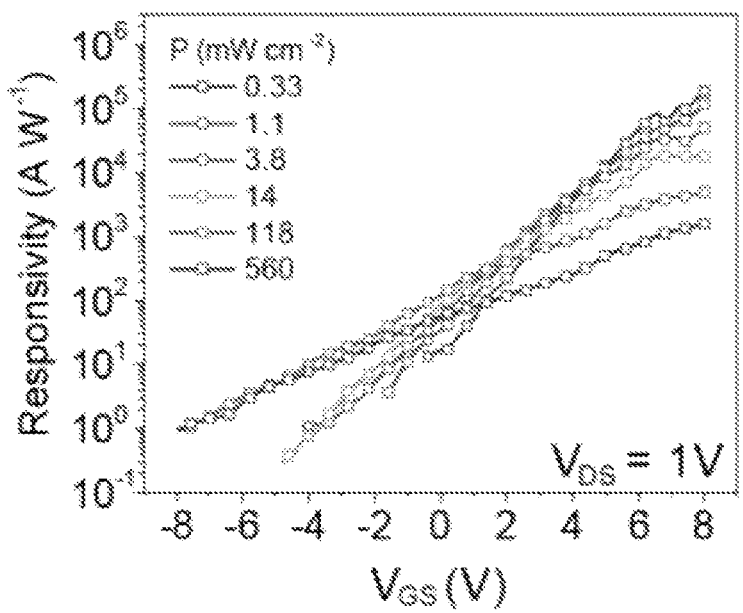
Figure 10:
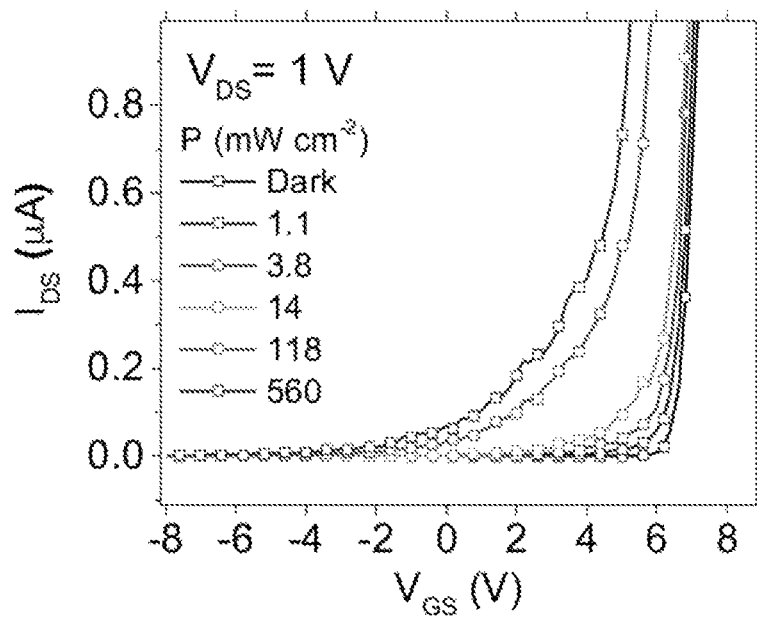
FIG. 10. Threshold voltage shifts under illuminated power. Threshold voltage of total current shifts under illumination at various light power densities compared to the dark current plot (black).

The spectral photocurrent response of the device (FIG. 9) indicates that the InSe device absorbs light at wavelengths below ~1,000 nm, which is coincident with the InSe fundamental band edge. Photocurrent ($I_{pc}$), $I_{pc}=I_{light}-I_{dark}$, of the device was measured as a function of gate bias ($V_{GS}$) and laser power at 514 nm to gain insight into the mechanism of photocurrent generation (FIG. 8C, D). Upon illumination, the threshold voltage of the transfer curve shifts towards less positive voltages compared to the dark current plot (FIG. 10), which is indicative of a strong photogating effect. Thus, $I_{pc}$ increases with both laser power and $V_{GS}$ (i.e., free carrier density) in tandem. However, the exponential dependence of $I_{pc}$ on $V_{GS}$ (FIG. 8D) becomes weaker at higher laser power, in agreement with photocurrent trends commonly observed in TMD photodetectors. The power ($P_\gamma$) dependence of the responsivity ($R_\lambda$) in accumulation ($V_{GS}$=8 V) is $R_\lambda \sim P_\gamma^{-0.7}$, with the power dependence becoming weaker in the subthreshold regime ($V_{GS}$<8 V). In fact, at $V_{GS}$=4 V, the trend reverses with $R_\lambda$ increasing with $P_\gamma$ at low $P_\gamma$. Both the exponential dependence of $I_{pc}$ on $V_{GS}$ (FIG. 8D) and the deviation from the power-law behavior of $R_\lambda$ (FIG. 8E) can be explained by the competing roles of deep and shallow traps as photo-sensitizers and recombination sites.

Figure 8E:
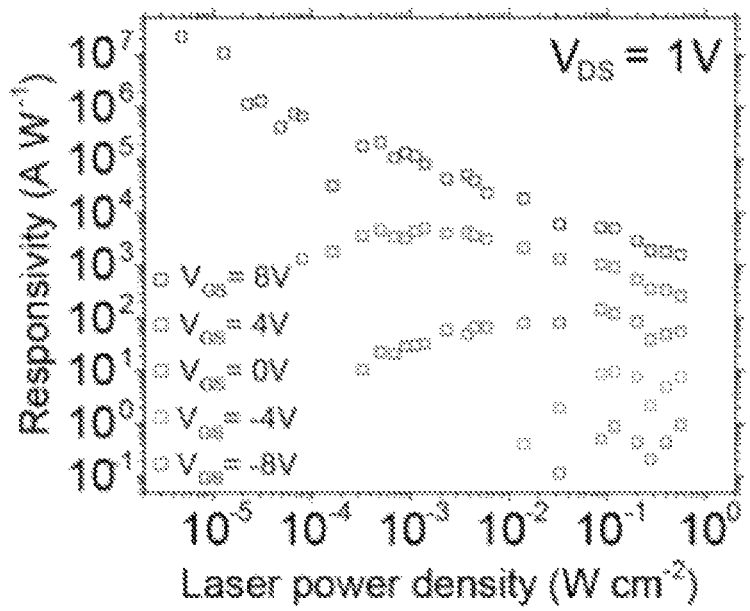

From the power-dependent responsivity plot in FIG. 8E, a maximum responsivity of ~$10^7$ A $W^{-1}$ is observed at a laser power ($\lambda$=514 nm) of ~$10^{-5}$ W $cm^{-2}$ with $V_{GS}$ and $V_{DS}$ held at 8 V and 1 V, respectively. Significantly, this value exceeds the highest responsivity reported for 2D material photodetectors by ~100-fold. In addition to this ultrahigh responsivity, time-resolved photocurrent measurements (FIG. 9D) show 90% rise and decay response times of $t_{rise}$=450 μs and $t_{decay}$=90 μs, respectively, which is among the highest reported for 2D material photodetectors. This superlative InSe photodetector performance can be attributed to several factors including pristine crystal quality and optimized device architecture. For example, the 41 nm InSe flake thickness maximizes photon absorption and thus photocarrier generation. In addition, the short channel length of 400 nm minimizes photocarrier transit time ($\tau_t$), which improves device response time and maximizes responsivity since $R_\lambda \sim \sigma_l/\tau_t$ where $\tau_l$ is the photocarrier lifetime. The high capacitance dielectric layer (20 nm $Al_2O_3$ with $C_{ox}$~3 μF $cm^{-2}$) also allows high charge accumulation at low $V_{GS}$, which facilitates measurements at low powers that minimize recombination losses.

Figure 8F:
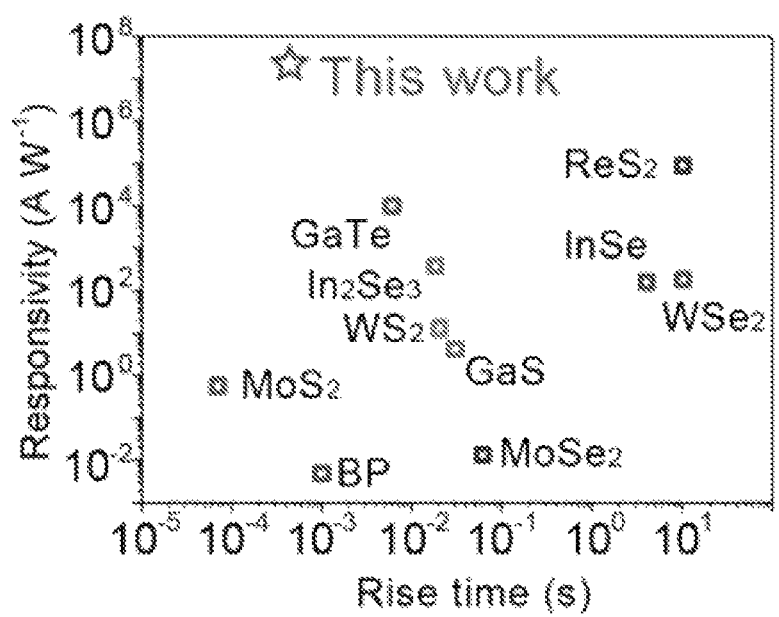
Figure 9A:
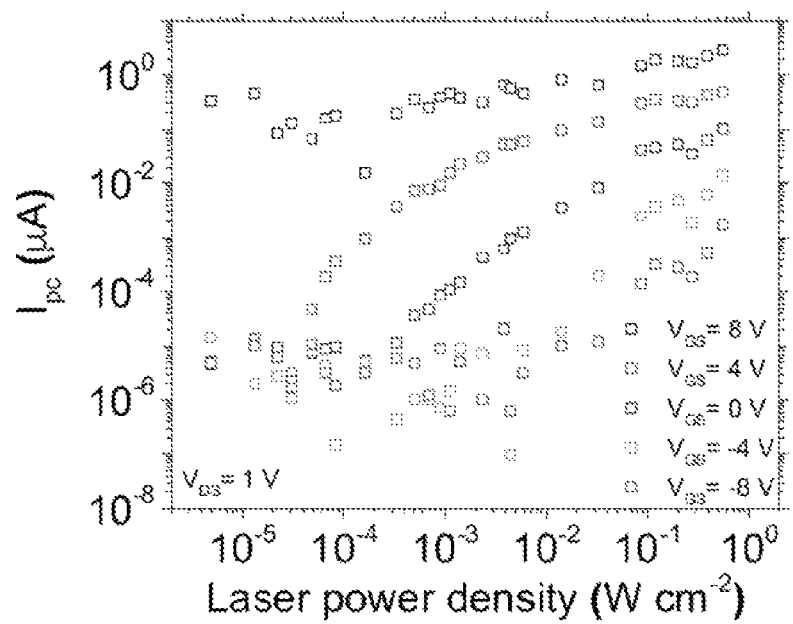
FIGS. 9A-D. Optoelectronic properties of a single InSe nanosheet. A, Power-dependent photocurrent measurement with different gate biases. B, Spectral response of the device. C, Time-resolved photocurrent measurement. D, Estimated rise and decay times.
Figure 9B:
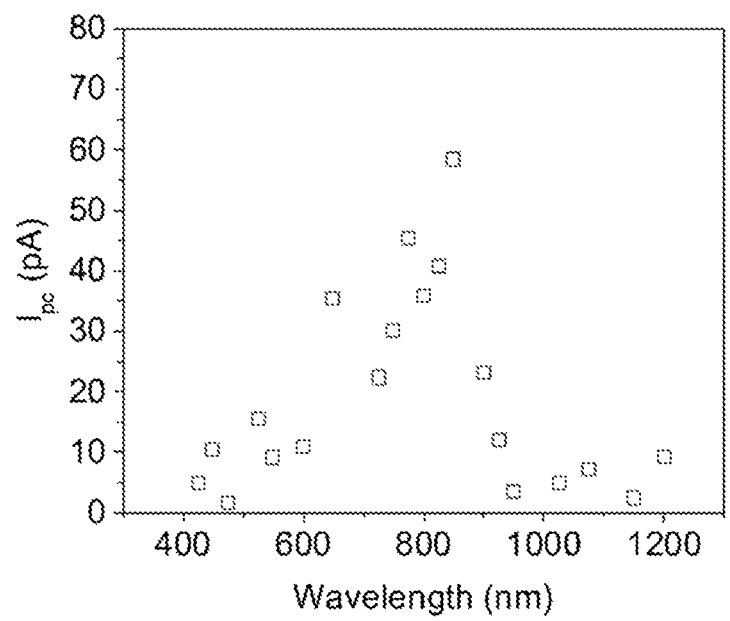
Figure 9C:
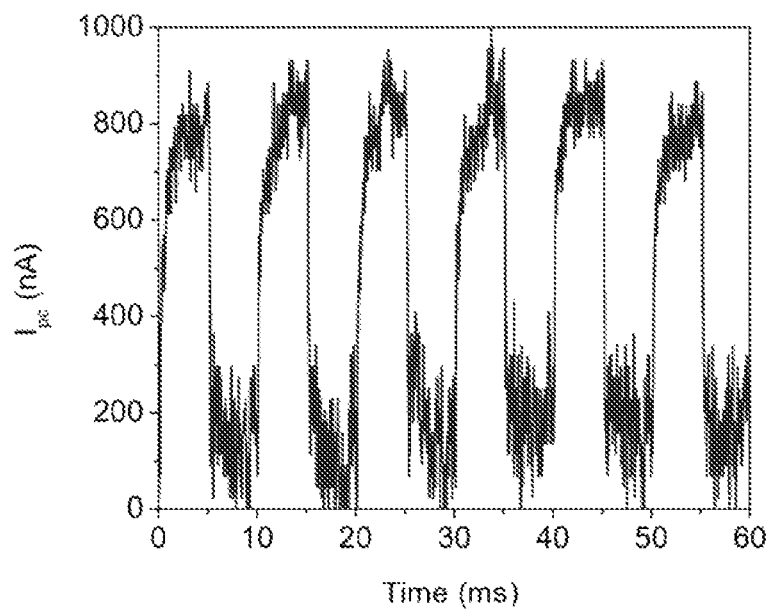
Figure 9D:
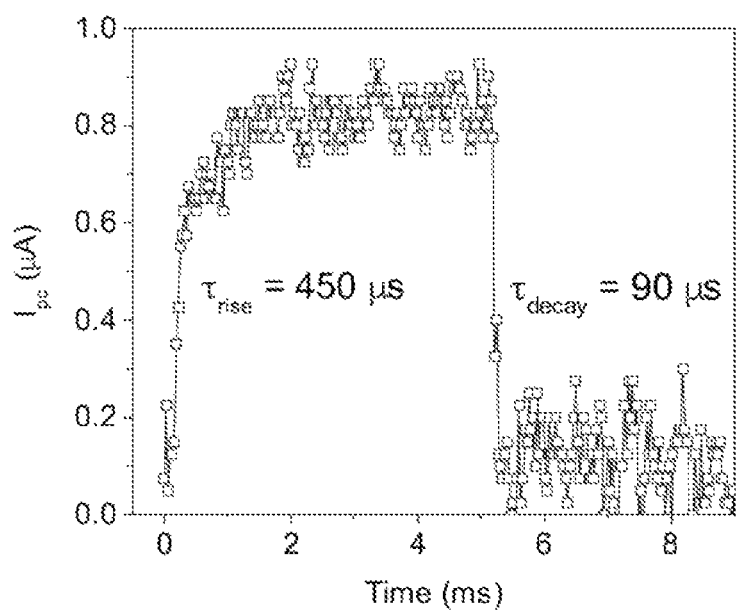
Figure 12A:
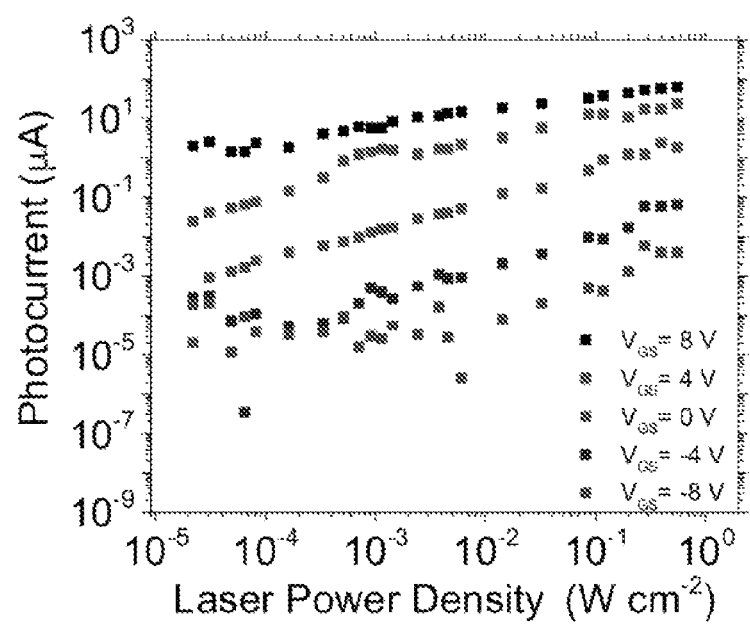
FIGS. 12A-B. Optoelectronic properties of a micromechanically exfoliated single InSe nanosheet. Power-dependent photocurrent (A) and responsivity (B) measured at different gate biases.
Figure 12B:
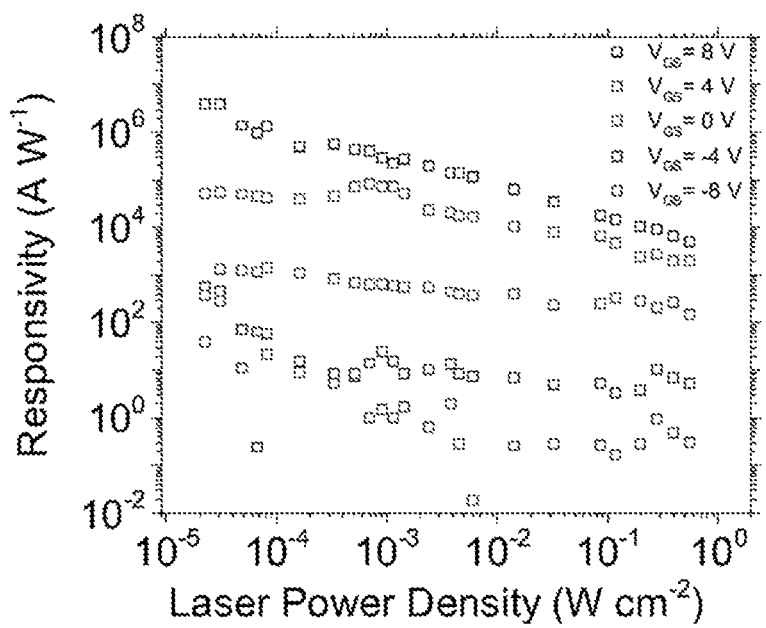
Figure 13A:
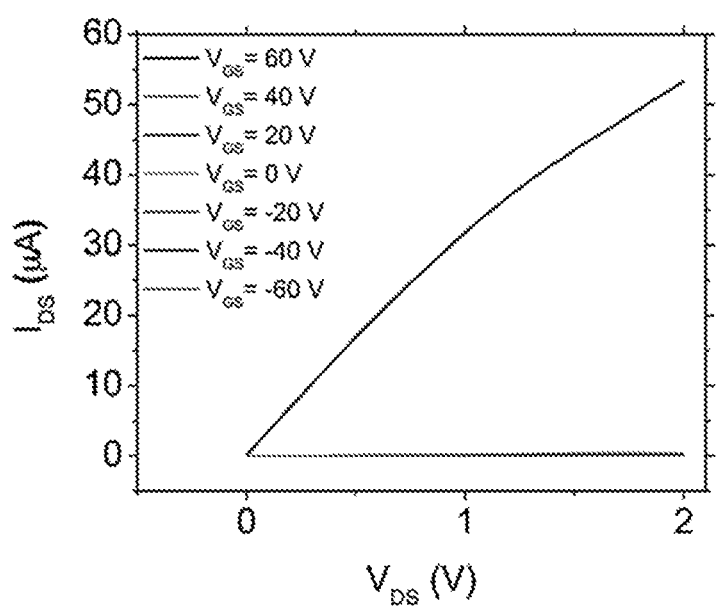
FIGS. 13A-B. $I_{DS}$-$V_{DS}$ characteristics for different gate biases from (A) 60 V to −60 V with a step of 20 V and (B) 60 V to 40 V with a step of 5 V.
Figure 13B:
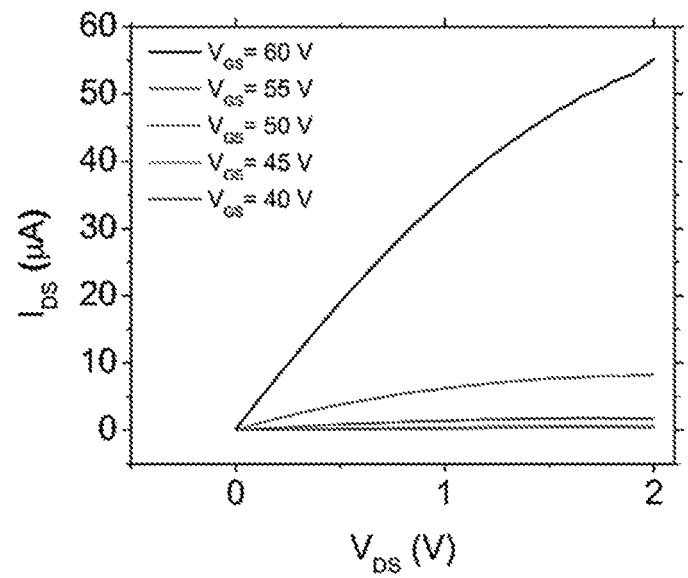
Figure 14A:
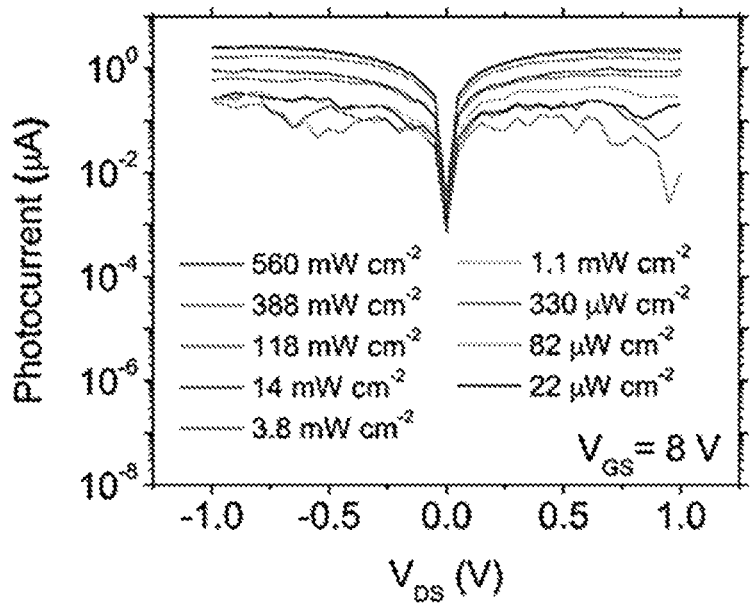
FIGS. 14A-C. Photocurrent versus $V_{DS}$ for different laser powers at $V_{GS}$ of (A) 8 V, (B) 0 V, and (C) −8 V.
Figure 14B:
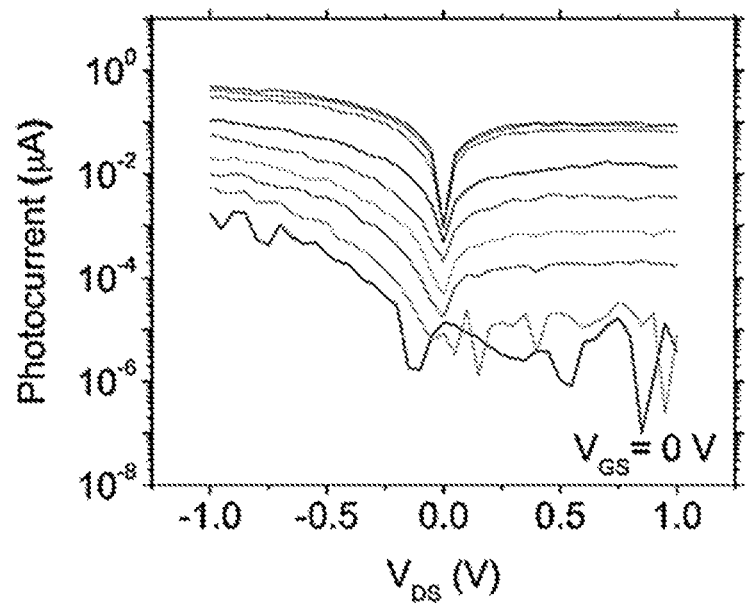
Figure 14C:
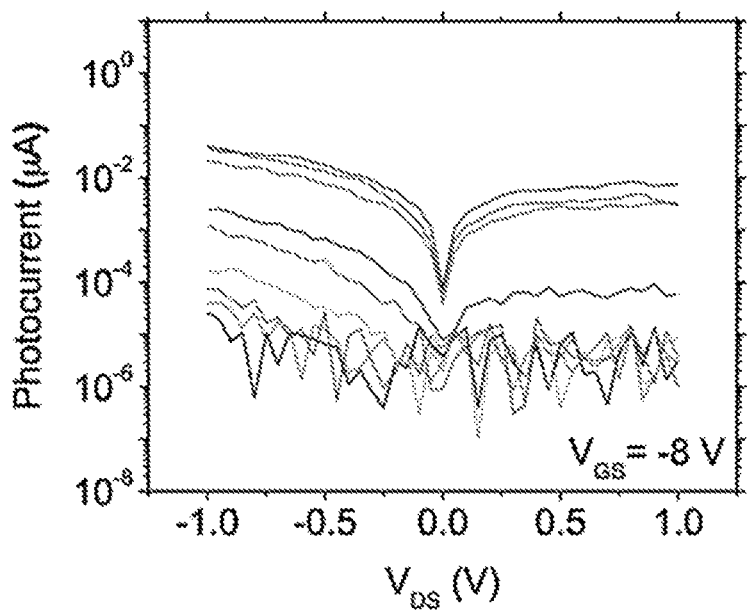
Figure 15A:
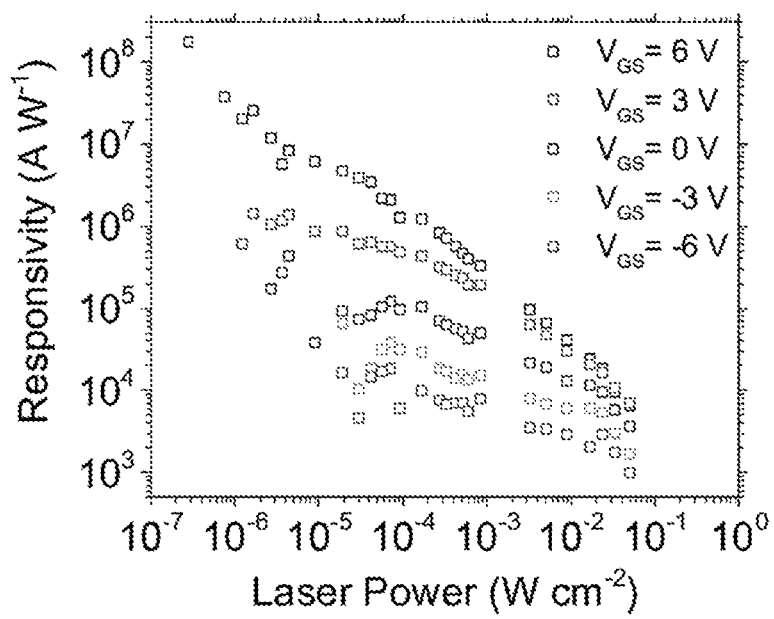
FIGS. 15A-D. A, Dependence of photoresponsivity on laser power for different $V_{GS}$ values for an InSe flake with a thickness of 100 nm. B, Photoresponsivity versus $V_{GS}$ for the same device. C, Plot of photoresponsivity as a function of laser power for different $V_{GS}$ values for an InSe flake with thickness of 94 nm. D, Photoresponsivity versus $V_{GS}$ for the same device.
Figure 15B:
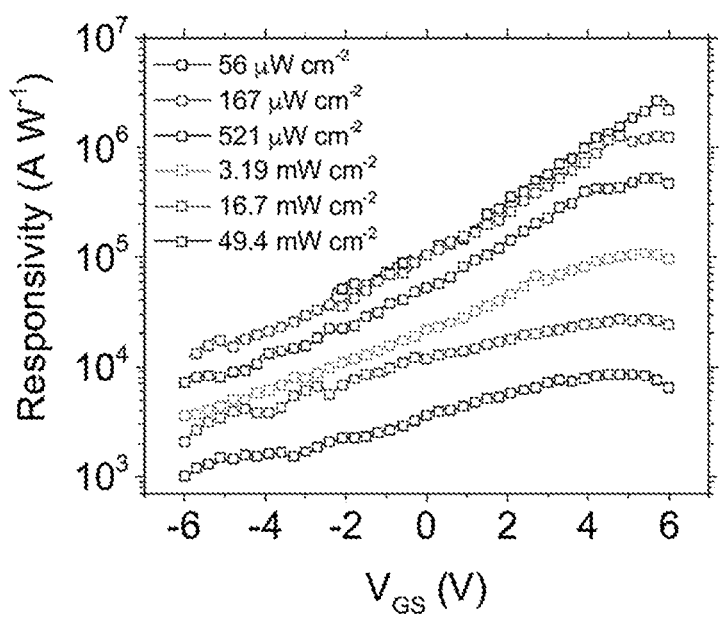
Figure 15C:
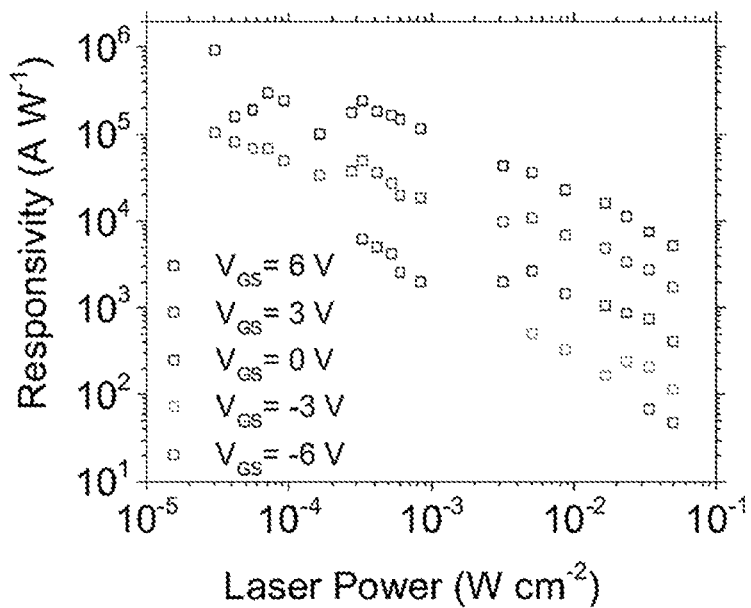
Figure 15D:
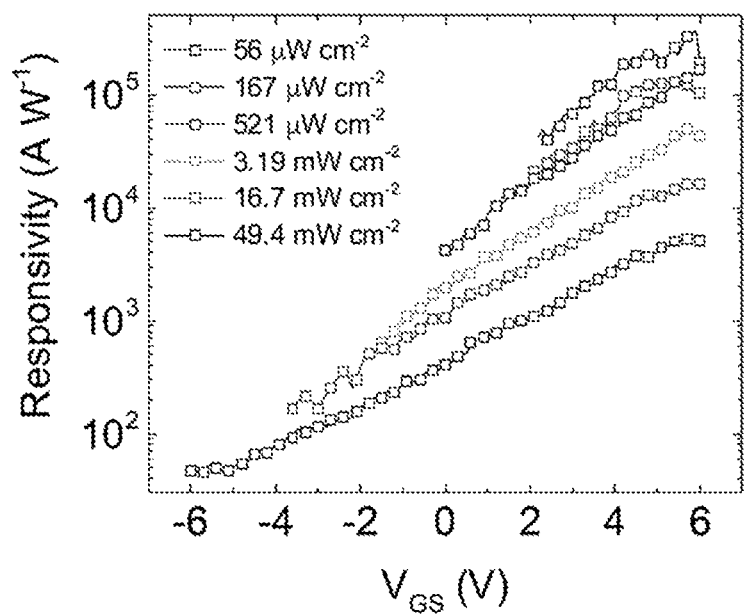
Figure 16:
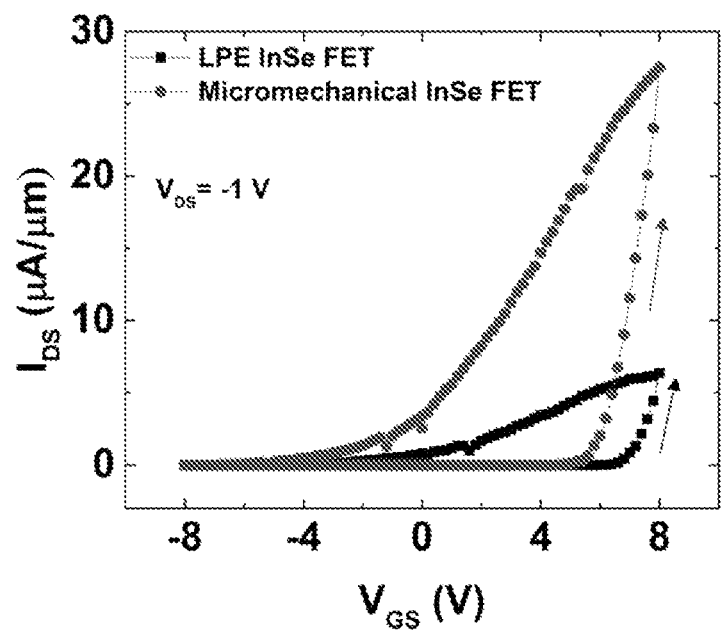
FIG. 16. Transfer characteristics of InSe devices. Comparative transfer characteristics of InSe field-effect transistors from liquid-phase exfoliation and micromechanical exfoliation showing both sweeps of gate bias.

As a control, micromechanically exfoliated 2D InSe devices were also fabricated from the same bulk InSe crystal that was used in the LPE experiments. A maximum responsivity of ~$10^7$ A $W^{-1}$ was obtained at ~$10^{-5}$ W $cm^{-1}$ for $V_{GS}$ and $V_{DS}$ at 8 V and 1 V, respectively. (See, FIG. 12.) A higher photocurrent is shown at more positive $V_{GS}$ because photogating from hole trapping near the surface shifts $V_{th}$ of the device under illumination into the regime of $V_{GS}>V_{th}$. Additionally, the high capacitance dielectric layer (20 nm thick $Al_2O_3$) also allows high charge accumulation at low $V_{GS}$, which facilitates measurements at low powers that minimize recombination losses. (See, FIGS. 13-14.) LPE devices were fabricated from a commercial powder to verify the InSe crystal quality and demonstrate reproducibility. (See FIGS. 15A-D.) Since the control and LPE processed InSe nanosheet devices (FIG. 16) show comparable performance, it can be concluded that exfoliation of InSe in deoxygenated co-solvent mixtures preserves intrinsic optoelectronic properties. Furthermore, by plotting the responsivity and rise times of previously reported 2D nanomaterial photodetectors (FIG. 8F), the present LPE processed InSe nanosheet devices are found to yield the highest performance among all 2D material photodetectors.

Figure 17A:
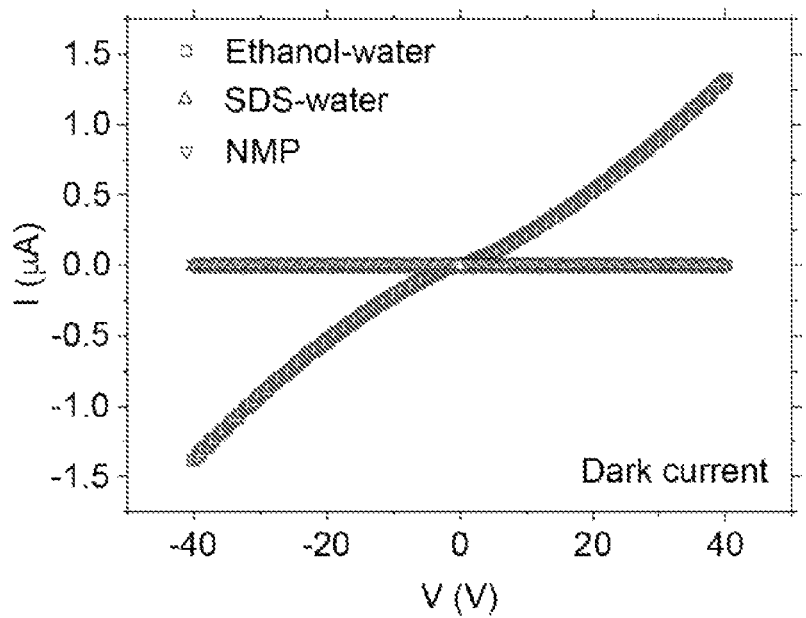
FIGS. 17A-D. I-V characteristics comparison of InSe thin films. A, Dark current curves of InSe thin-film transistors processed in ethanol/water, SDS/water, and NMP. B,C,D, I-V characteristics for the ethanol/water, SDS/water, and NMP devices under illumination, respectively.
Figure 17B:
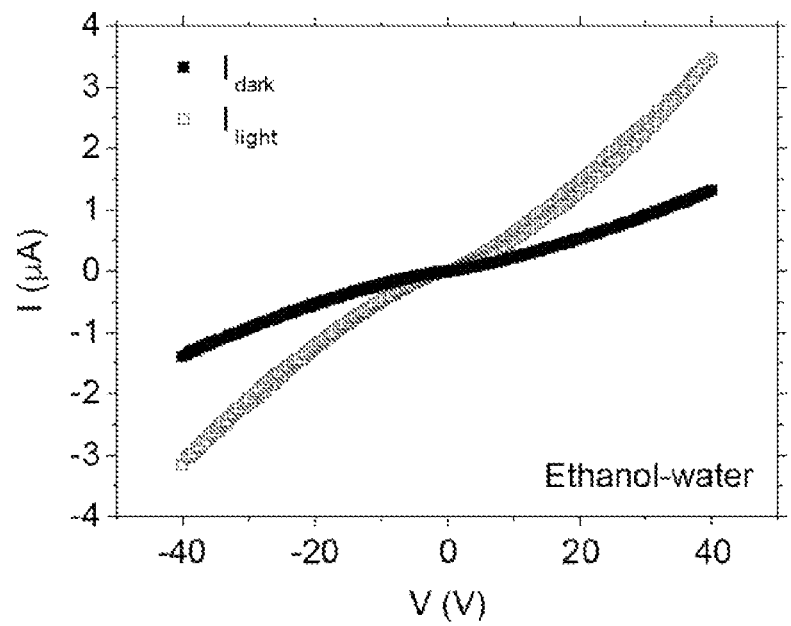
Figure 17C:
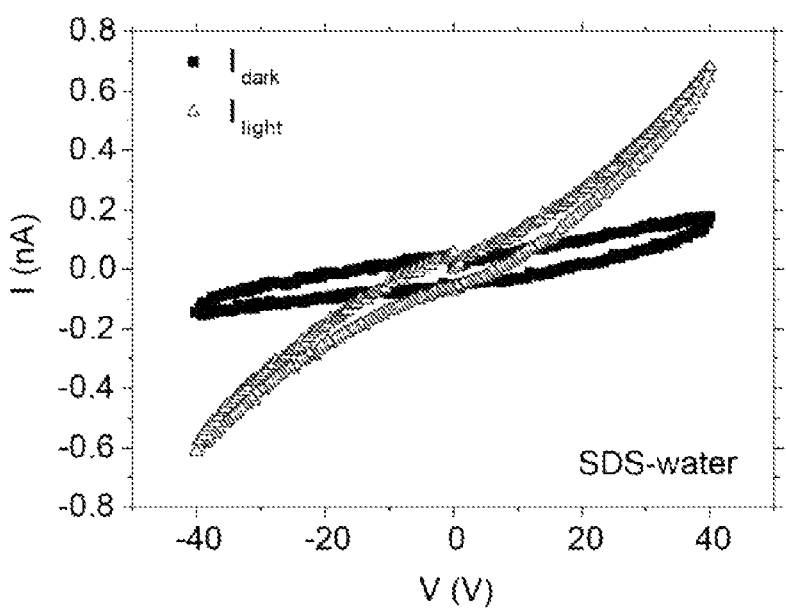
Figure 17D:
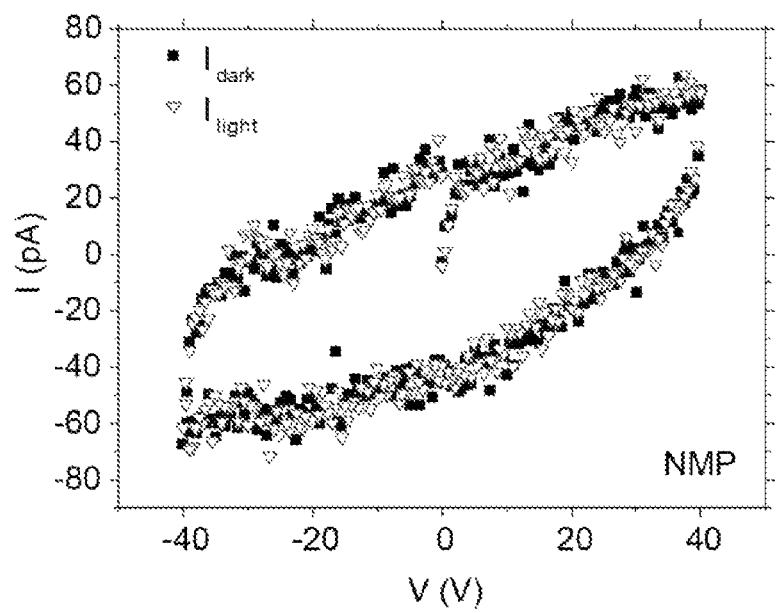
Figure 18A:
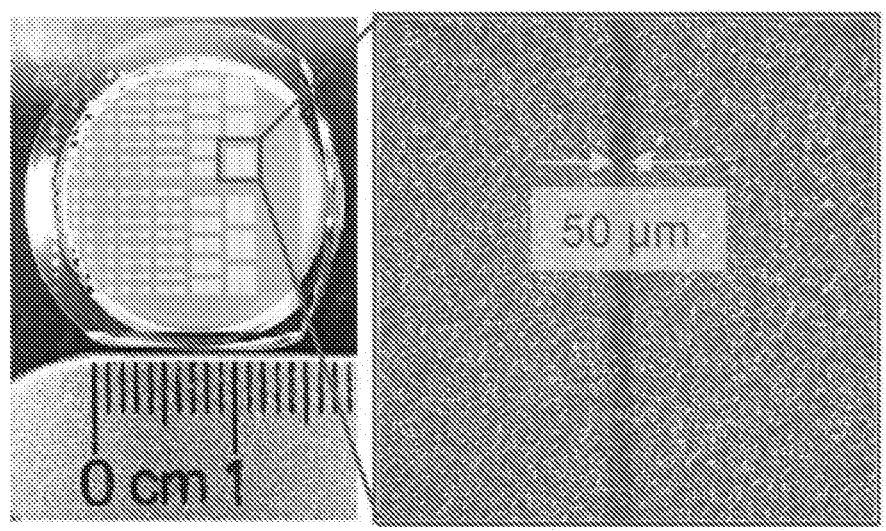
FIGS. 18A-F. Optoelectronic properties of liquid-phase exfoliated InSe thin films. A, Optical microscopy image of large-area InSe thin-film devices with a zoomed-in image of a device with a channel length of 50 μm. B, Current-voltage characteristics of a thin-film device processed in ethanol/water (diagonal plot) with two control devices processed in SDS-water and NMP (overlapping plots). C, Current-voltage characteristics of the ethanol/water processed thin-film device in dark and under illumination. $I_{pc}$ is defined as $I_{pc}=I_{light}-I_{dark}$. D, Spectral response of the ethanol/water processed thin-film device along with the PL spectrum of thick InSe nanosheets. E, Power dependence of $I_{pc}$ (left) and responsivity (right). F, Plot of responsivity versus rise time that compares this work to previously reported 2D nanomaterial thin-film photodetectors. LB=Langmuir-Blodgett assembly; P=inkjet-printing; CVD=chemical vapor deposition. All devices had no applied gate voltage.
Figure 18B:
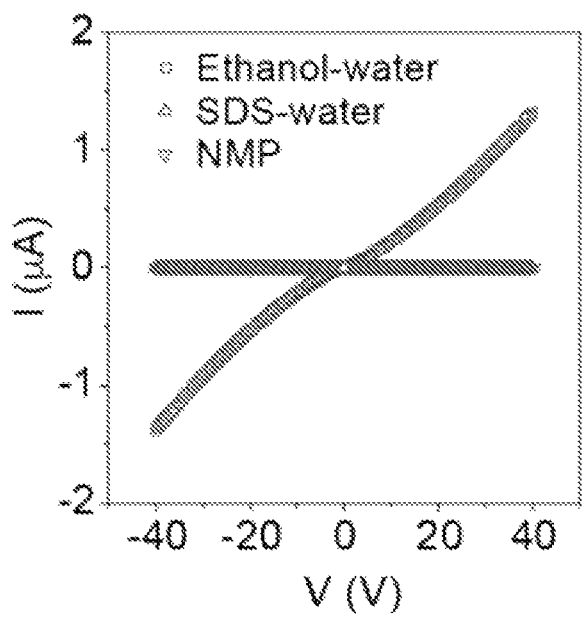
Figure 18C:
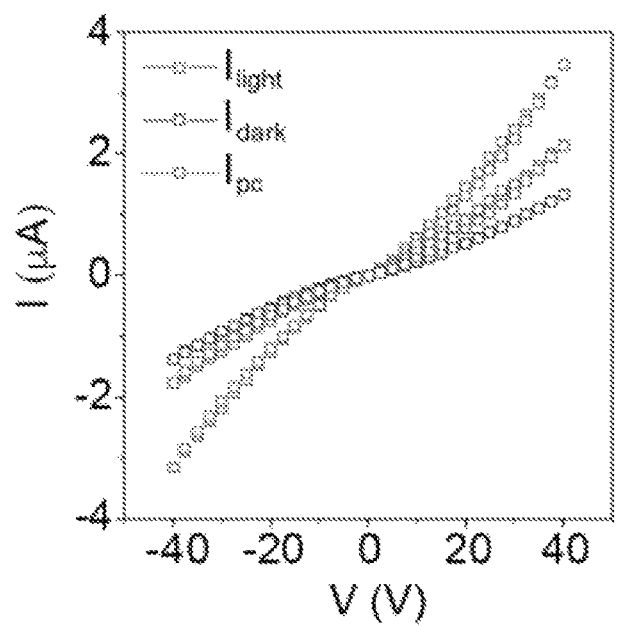

In addition to individual nanosheet devices, the LPE InSe dispersions were utilized to form percolating thin-film photodetectors. In particular, InSe thin-films were formed via vacuum filtration on anodic aluminum oxide (AAO) membranes. In FIG. 18A, an optical microscopy image of a large-area thin-film device is shown with a 50 μm channel length. To illustrate the superior electrical performance of InSe thin-film devices processed via the ethanol/water co-solvent approach, two control InSe thin films were also processed using traditional LPE methods, namely aqueous surfactant (sodium dodecylsulfate, SDS) solutions and NMP dispersions. Charge transport characteristics were then measured for all three samples under identical vacuum conditions (~$5\times10^{-5}$ Torr). In FIG. 18B, the InSe thin film processed using co-solvents shows ~4 orders of magnitude higher conductivity than the SDS-water processed film, while the NMP sample was not electrically conductive. Dark and illuminated characteristics of the co-solvent processed device (FIG. 18C) show a linear bias response, which suggests near-Ohmic conduction in the film (dark and illuminated charge transport characteristics of the SDS-water and NMP devices are provided in FIG. 17).

Without limitation to any one theory or mode of operation, improved performance characteristics available through use of this invention may be attributable to the absence of a surfactant in an amount at least partially sufficient for surface contamination therewith of an indium selenide nanosheet or thin-film thereof. The substantial absence of a surfactant can be shown by improved performance characteristics of the sort discussed and demonstrated herein.

Figure 18D:
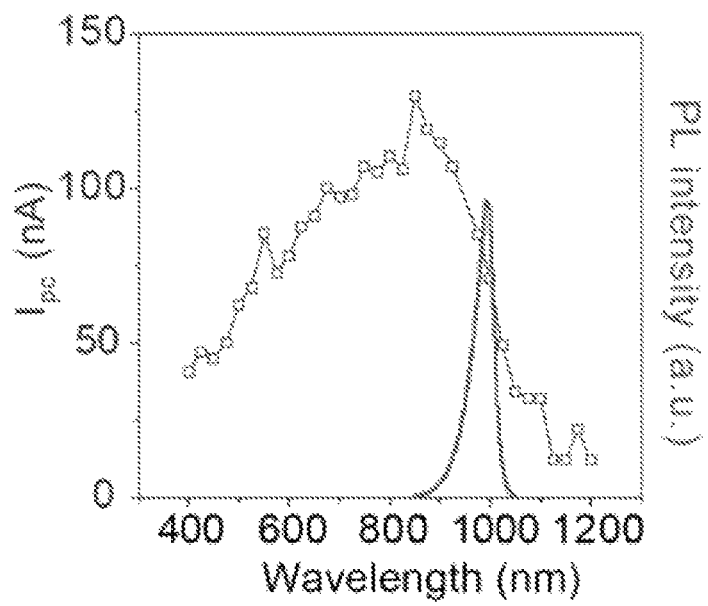
Figure 18E:
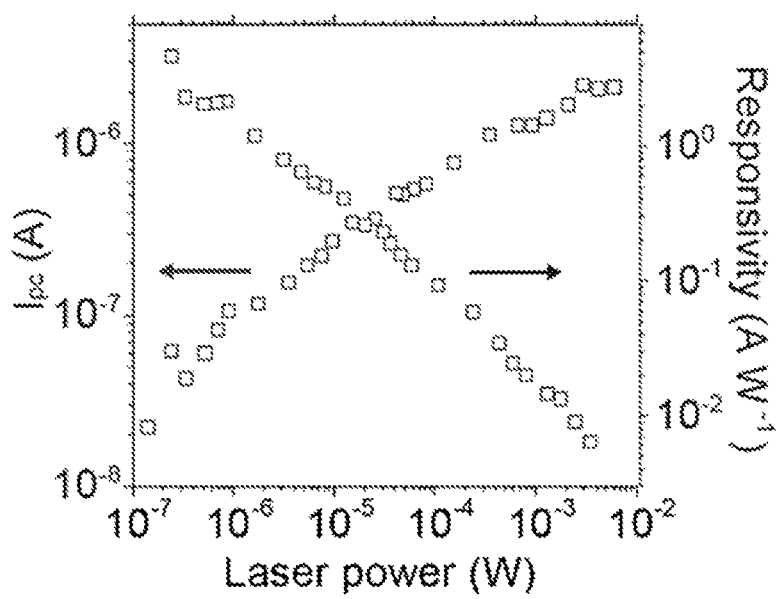
Figure 18F:
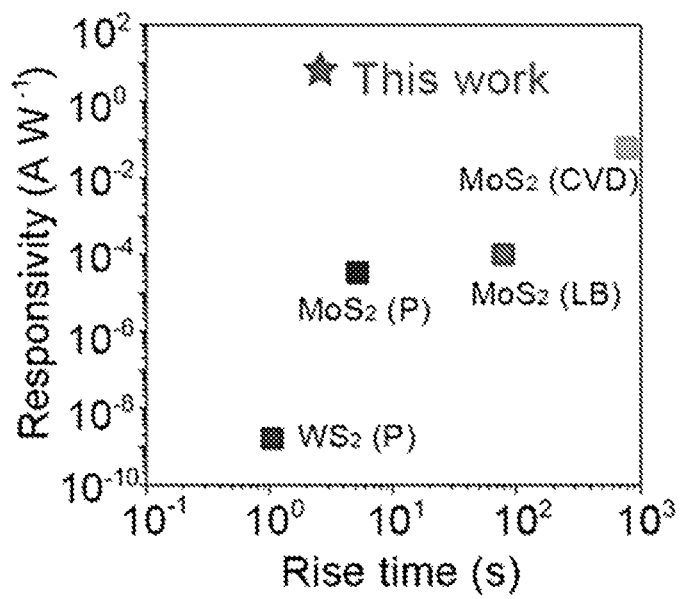
Figure 19A:
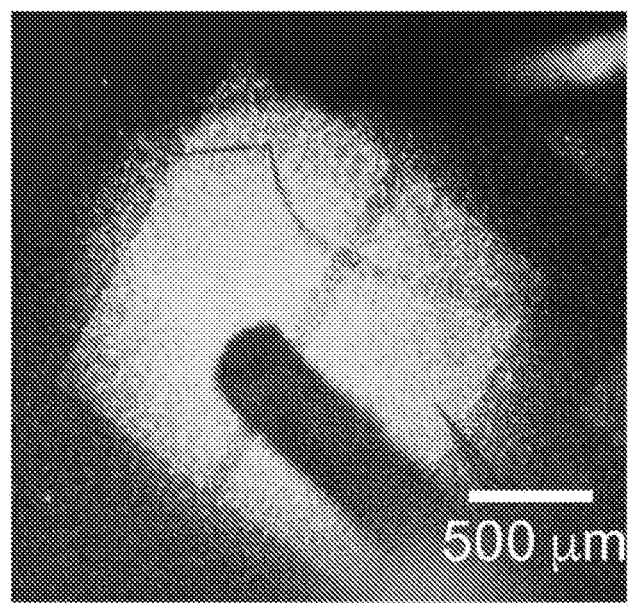
FIGS. 19A-C. InSe thin-film photodetector measurements. A, Optical image of the laser spot on the device. B, Dark current before and after photocurrent measurement. C, Time-resolved photocurrent measurement of an InSe thin-film device.
Figure 19B:
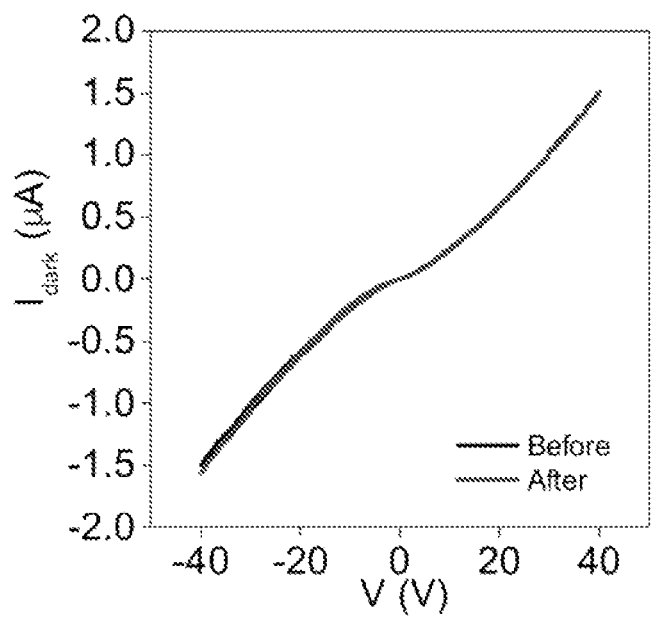
Figure 19C:
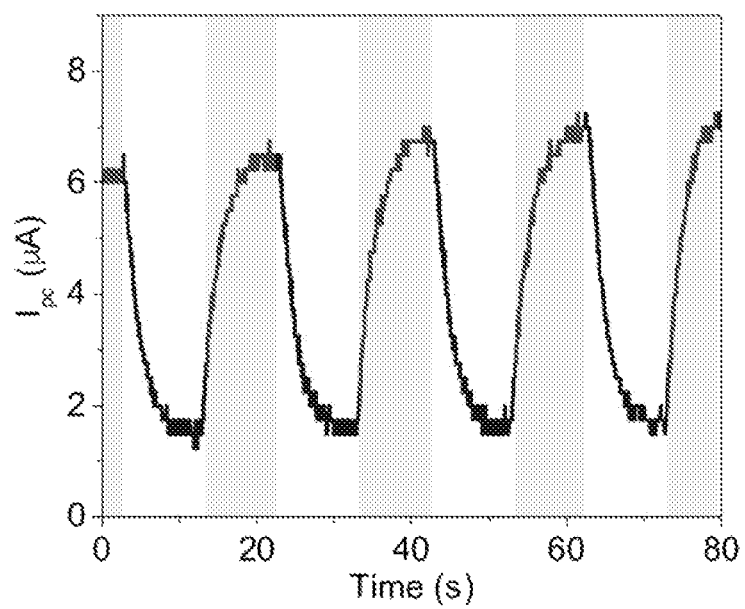
Figure 20A:
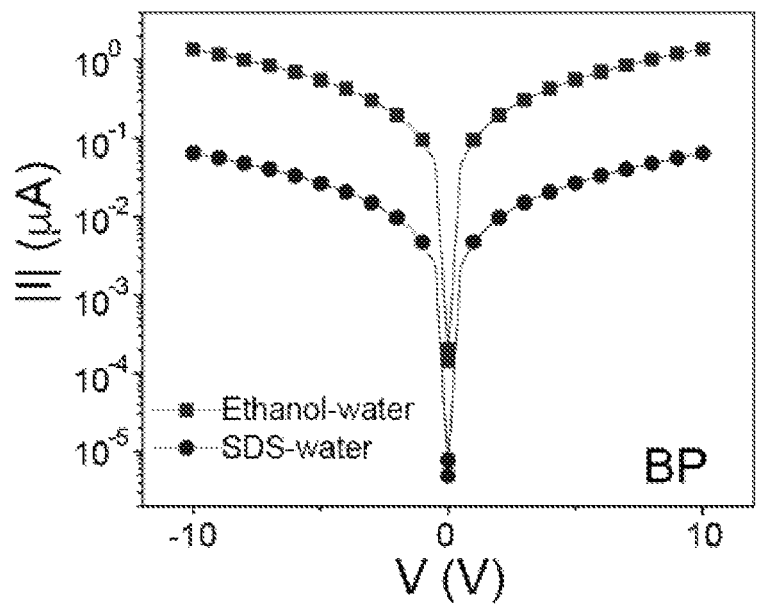
FIGS. 20A-D. Comparison of I-V characteristics of thin films of (A) BP, (B) $MoS_2$, (C) $WS_2$, and (D) $WSe_2$ in ethanol-water (upper plot) compared to surfactant-based aqueous systems (lower plot). The surfactant is sodium dodecyl sulfate (SDS).
Figure 20B:
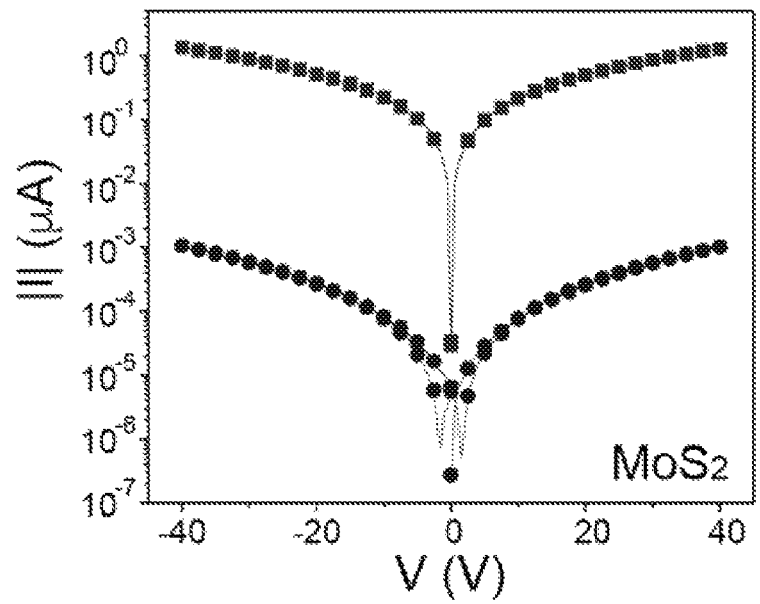
Figure 20C:
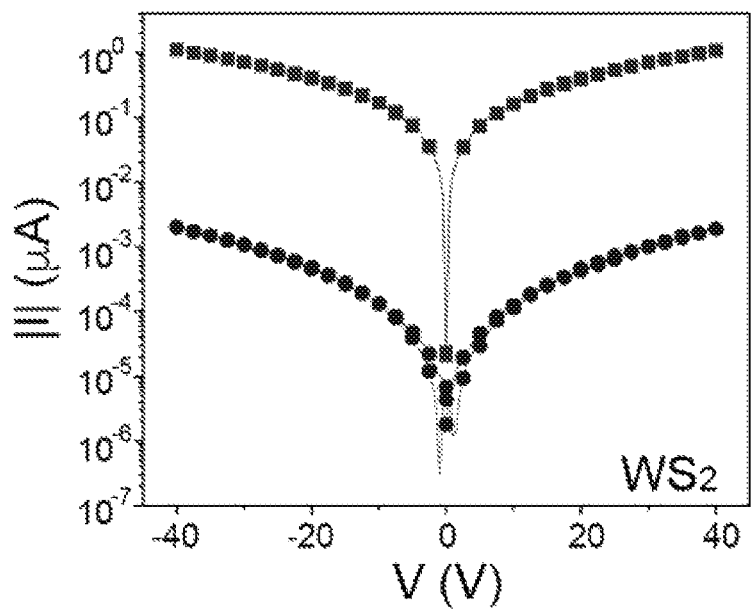
Figure 20D:
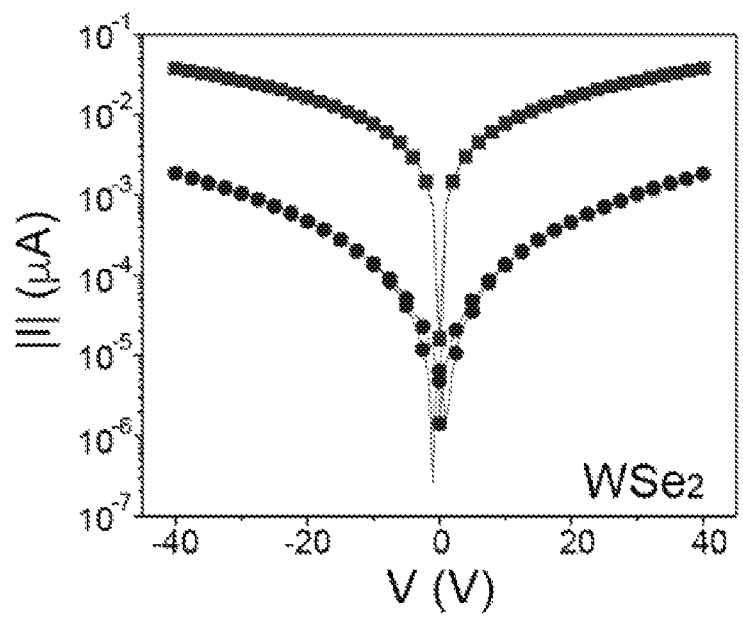

The spectral response of the percolating thin-film device (FIG. 18D) is similar to that from single-nanosheet devices (FIG. 18B), but with a broader peak, which can be attributed to heterogeneity in the InSe thin-film. The time response (FIG. 19C) of the thin-film device shows 90% rise and decay in photocurrent with a characteristic time of ~3 sec, which is reasonably fast considering the 50 μm channel length and percolating nature of the film. The observed sub-linear dependence of photocurrent (and photoresponsivity) with power is likely due to bimolecular recombination from InSe photoactive traps (FIG. 18E). Nevertheless, the thin-film device shows a maximum responsivity of ~5 A $W^{-1}$, which compares favorably with previously reported solution-processed 2D nanomaterial thin-film photodetectors in addition to large-area photodetectors based on chemical vapor deposition MoS$_2$ thin films (FIG. 18F). These results confirm the high quality of the constituent LPE InSe flakes and illustrate that the surfactant-free, low boiling point, deoxygenated co-solvent approach yields minimal residues that traditionally have compromised flake-flake contacts and resulting thin-film electronic properties.

As demonstrated, chemically pristine InSe nanosheets have been successfully exfoliated and stabilized in a surfactant-free, low boiling point, deoxygenated co-solvent system in a manner that preserves superlative optoelectronic properties both for individual flakes and percolating thin films. In particular, LPE InSe nanosheets show the highest responsivity (~$10^7$ A W$^{-1}$) among 2D material photodetectors, surpassing the previous record ReS$_2$ photodetector by two orders of magnitude. Furthermore, this residue-free approach allows the scalable preparation of large-area InSe thin films, which possess the highest responsivity among 2D material thin-film photodetectors.

Examples of the Invention

The following non-limiting examples and data illustrate various aspects and features relating to the methods, compositions and/or thin-film devices of the present invention, including the preparation of few-layer nanomaterials, including but not limited to indium selenide nanosheets, with co-solvent systems, as are described herein. In comparison with the prior art, the present methods, compositions and/or devices provide results and data which are surprising, unexpected and contrary thereto. While the utility of this invention is illustrated through the use of several nanosheet materials, co-solvent systems and thin-films, it will be understood by those skilled in the art that comparable results are obtainable with various other nanosheet materials, co-solvent systems and thin-films, as are commensurate with the scope of this invention.

Example 1

InSe crystal growth. The InSe crystal growth was performed from a non-stoichiometric melt consisting of 52 at. % of In (5N; granules from Sigma-Aldrich) and 48 at. % of Se (5N; granules from Sigma-Aldrich). For the synthesis of a 20 g batch, 12.2338 g of In and 7.7662 g of Se were used. The precursors were placed in a quartz glass ampoule (15 mm×100 mm; 2 mm wall thickness) and evacuated to a base pressure of 7.5 Torr. The ampoule was melted and sealed by an oxygen-hydrogen welding torch, placed in a muffle furnace horizontally, and heated at 760° C. (5° C. min' heating rate) for 12 hrs. The melted reaction mixture was shaken several times to produce a homogeneous solution. Finally, the ampoule was cooled at room temperature with a cooling rate of 0.1° C. min$^{-1}$. The top and bottom part of the crystalline mass was removed to minimize impurities. The extracted InSe crystals were stored in a dark N$_2$ glove box to minimize chemical degradation.

Example 2

LPE of InSe. For solvent exfoliation experiments, ethanol and deionized water mixtures were sparged with ultrahigh purity grade Ar for at least 1 hr to remove dissolved oxygen. A customized tip sonicator setup was prepared to minimize ambient exposure, as reported previously. (See, Kang, J. et al. Stable aqueous dispersions of optically and electronically active phosphorene. *Proc. Natl. Acad. Sci. U.S.A.* 113, 11688-11693 (2016); and Kang, J. et al. Solvent exfoliation of electronic-grade, two-dimensional black phosphorus. *ACS Nano* 9, 3596-3604 (2015).) The resulting deoxygenated co-solvent mixture and InSe crystals were placed in the sealed tip sonicator vessel with an initial concentration of 1 mg ml$^{-1}$ under an Ar atmosphere (<10% relative humidity). The container was then connected to a sonicator (Fisher Scientific Model 500 Sonic Dismembrator). The InSe crystals were exfoliated by ultrasonication at ~30 W for 2 hrs in an ice bath under pulsed conditions (2 sec on and 1 sec off) to avoid solvent evaporation. As-prepared InSe dispersions were then centrifuged to remove unexfoliated InSe crystals (Avanti J-26 XP, Beckman Coulter).

Example 3

Field-effect transistor fabrication and charge transport measurement. The InSe nanosheets were collected on AAO membranes with 20 nm pore size by vacuum filtration. Following vacuum filtration, the nanosheets on the membrane were transferred to a 20 nm Al$_2$O$_3$ substrate by PDMS stamping. (See, Kang et al, supra.) Features were defined with EBL in PMMA. To make electrical contact, 20 nm of Cr and 40 nm of Au were used as the contact metals. Electrical measurements of InSe FETs were performed in a Lakeshore CRX 4K probe station at less than 5×10$^{-4}$ Torr pressure at room temperature. Two Keithley Source Meter 2400 units were used to measure the current-voltage (I-V) characteristics. Equation (1) was used to calculate carrier mobility:

$$\mu_{eff} = \frac{L g_d}{W C_{ox} V_{DS}} \quad (1)$$

where $\mu_{eff}$ is the field effect mobility, L is the channel length (obtained from optical micrographs), $g_d$ is the transconductance, W is the channel width (obtained from optical micrographs), $C_{ox}$ is the oxide capacitance per unit area, and $V_{DS}$ is the applied source-drain bias.

Example 4a

InSe thin-film assembly and device fabrication. The ~200 nm thick InSe films were formed on AAO membranes with 20 nm pore size by vacuum filtration. The films were annealed at ~80° C. for 5 min in a N$_2$ glovebox to remove residual solvents. Electrodes (10 nm Ti/50 nm Au) were directly deposited onto the film using thermal evaporation (Lesker Nano38) through a shadow mask.

Example 4b

InSe thin-film assembly and I-V characteristics comparison. For InSe thin-film assembly, 60 mg of InSe crystals in 15 ml of co-solvent mixture were exfoliated via ultrasonication in a sealed tip sonicator container at ~40 W for 1 hr in an iced bath. The as-prepared dispersion was then centrifuged at 5 krpm to remove unexfoliated crystals. 1 ml of the resulting supernatant was filtered on an AAO membrane with ~20 nm pore size. Three InSe thin-films were prepared: ethanol/water, N-methylpyrrolidone (NMP), and aqueous surfactant solution. Here, sodium dodecylsulfate (SDS) was used as the surfactant to stabilize InSe nanosheets in water. Also, all three solvents were deoxygenated by ultrahigh purity Ar purging for at least 1 hr. To make electrical contact to the flake, 10 nm of Ti and 50 nm of Au were used as the contact metals. Electrical measurements of InSe field-effect transistors (FETs) were performed in a Lakeshore CRX 4K probe station at less than $5\times10^{-4}$ Torr pressure at room temperature. Two Keithley Source Meter 2400 units were used to measure the I-V characteristics. See FIG. 17A for a comparison of dark current curves for InSe thin films prepared in ethanol/water, NMP, and SDS/water. Also, I-V characteristics under 532 nm laser illumination are shown in FIGS. 17B-D. Please note that no current flows from the NMP-processed thin film, and ~4 orders of magnitude lower current flows from the SDS/water-processed thin film. These results show the significant advantage of ethanol/water in minimizing residual contaminants, which significantly improves the electrical contacts between InSe nanosheets.

Example 5

Figure 11A:
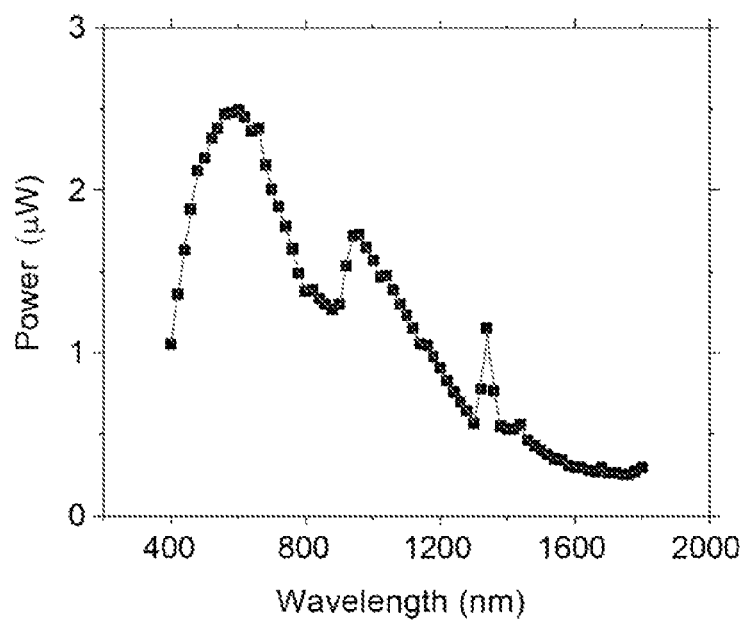
FIGS. 11A-D. Photodetector measurement setup. A, Wavelength-dependent power of the Xe lamp for spectrally-resolved photocurrent measurements. B, Optical power dependence on the input current of the laser diode (wavelength=515.6 nm) for power-dependent photocurrent measurements. C, Power versus distance of a knife edge crossing the laser spot size of ~50 microns, yielding an integrated Gaussian profile. The power was measured with a Si photodiode. D, Derivative of the integrated power from (C) that reveals the power profile of the laser spot. The power profile is fit to a Gaussian function (spot size~50 microns).
Figure 11B:
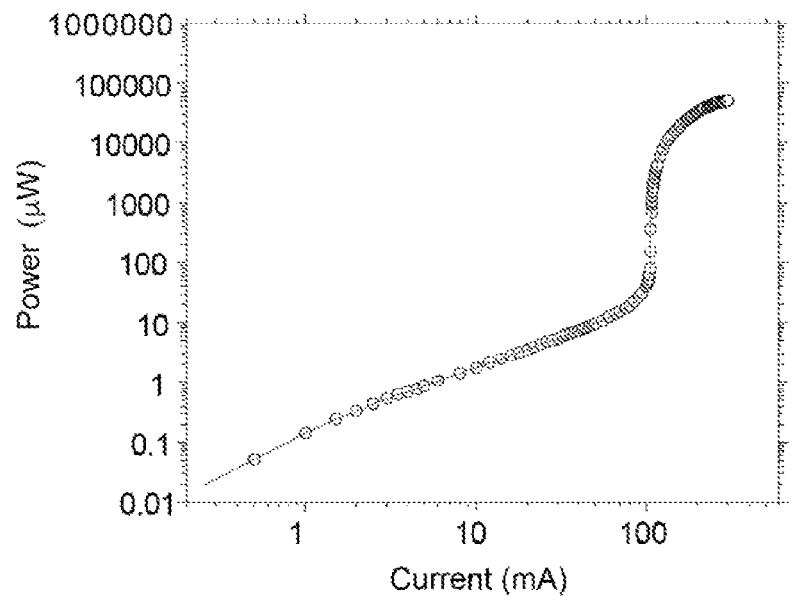
Figure 11C:
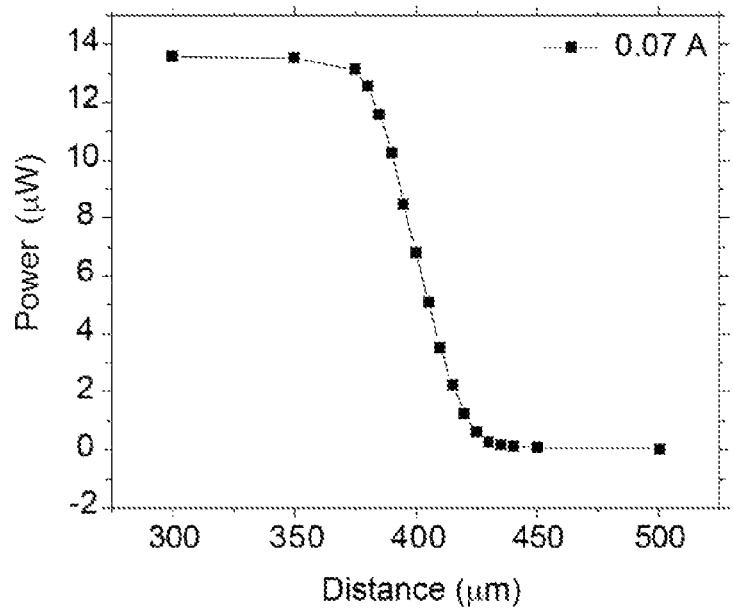
Figure 11D:
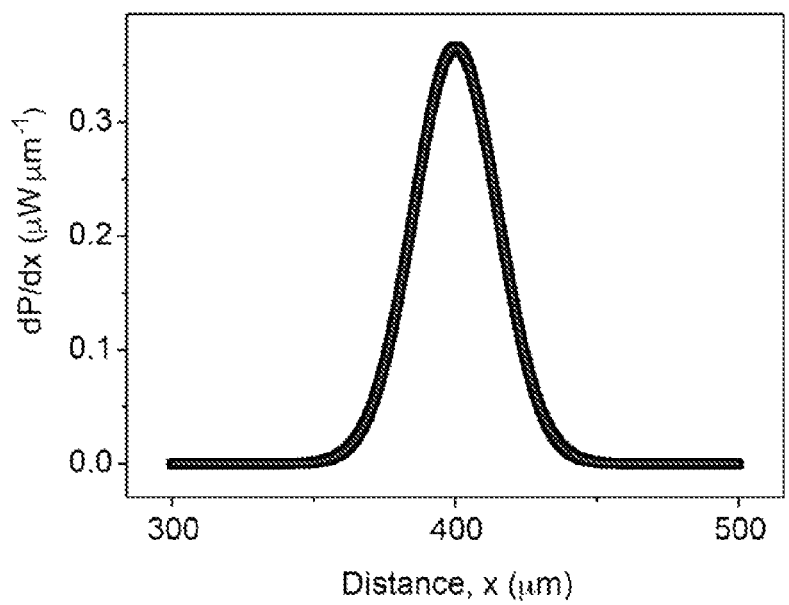

Electrical and photocurrent measurements. All electrical and photocurrent measurements were carried out in vacuum (pressure~$5\times10^{-5}$ Torr) using a probe station (LakeShore CRX 4K), Keithley source-meters, and LabVIEW programs. The probe station was coupled to two different light sources by a multi-mode fiber optic cable. Wavelength-dependent photocurrent was measured with a 250 W Xenon arc discharge lamp coupled to a monochromator with line width of ~20 nm (Newport 74125). The highest net power of ~3 µW was achieved at a wavelength of 600 nm (FIG. 11A shows the full power spectrum). Power-dependent and time-dependent photocurrent measurements were performed using a laser diode with excitation wavelength of 515.6 nm (LP520MF100, Thor Labs) operating in a constant-current mode while the temperature (25° C.) was controlled by a TEC controller (ITC4001, Thor Labs). FIG. 11B shows the optical power dependence as a function of the laser diode current. All power measurements were performed with a Si photodiode (5120C, Thor Labs) coupled with an energy meter (PM100D, Thor Labs). Laser pulses were generated with an electronic chopper, and the resulting electrical signal was captured with a digital oscilloscope.

Example 6

Transmission electron microscopy (TEM). A droplet of InSe dispersion was deposited on a holy carbon TEM grid (Ted Pella) and fully dried with $N_2$. The TEM grid was then loaded in the TEM sample holder with fewer than 5 min exposure to ambient air. The TEM measurement was performed with a JEOL JEM-2100 TEM at an accelerating voltage of 200 keV.

Example 7

X-ray diffraction (XRD). XRD spectra were measured using a Bruker D8 Discoverer diffractometer in Bragg-Brentano parafocusing geometry. Cu Kα radiation was used. Diffraction patterns were collected between 5° and 80° of 2θ with a step of 0.01° and 0.5 s/step counting time. The obtained data were evaluated using the HighScore Plus 3.0e software.

Example 8

Raman/photoluminescence (PL) spectroscopy. Solid-state Raman/PL spectra were obtained using a Horiba Xplora Raman/PL system with an excitation wavelength of 532 nm. The spectra were collected for 100 sec using a 50× objective with a laser power of ~0.14 mW. PL spectra for the solution sample in FIG. 5D were obtained using a Horiba Fluorolog-3 spectrofluorometer. Data were collected in a quartz cuvette for 6 sec with an excitation wavelength of 320 nm.

Example 9

Optical absorbance spectroscopy. Optical absorbance spectra were obtained using a Cary 5000 spectrophotometer (Agilent Technologies). A plastic cuvette with 10 mm path length was used. The baseline from the co-solvent was subtracted from the spectra.

Example 10

Extinction coefficient measurements. Different volumes of InSe dispersion in co-solvent after centrifugation were vacuum filtered on anodic aluminum oxide (AAO) membranes possessing a ~20 nm pore size (Anodisc, Whatman™). The concentration of dispersed InSe was calculated by measuring the weight difference of the AAO membrane before and after vacuum filtration. Optical absorbance per cell length (A/l) was determined from optical absorbance spectra at 400 nm. Using Beer's law ($A=\alpha l C_{BP}$), an extinction coefficient of 585.7 L $g^{-1}m^{-1}$ at 400 nm was extracted.

Example 11

Atomic force microscopy (AFM). As-prepared InSe solutions were deposited onto pre-annealed (~80° C.) Si substrates and dried on a hot plate at 80° C. for 5 min. All height and amplitude measurements were performed in tapping mode using an Asylum Cypher AFM with Si cantilevers (~290 kHz resonant frequency). Images were taken in the repulsive regime using a minimum of 512 samples per line. The scanning rate was ~0.4 Hz.

Example 12

X-ray photoelectron spectroscopy (XPS). An ultrahigh vacuum (UHV) Thermo Scientific ESCALAB 250 Xi XPS system was used at a base pressure of ~$5\times10^{-10}$ Torr to gather XPS data. The XPS system has a binding energy resolution of ~0.3 eV using a monochromated Al Kα X-ray source at ~1486.7 eV (~400 µm spot size). All core level spectra were averaged over 5 scans taken at a 100 ms dwell time using a pass energy of 15 eV. When using charge compensation, all core levels were charge corrected to adventitious carbon at ~284.8 eV.

Example 13

InSe photodetector measurement. Spectrally resolved photocurrent data were normalized to power spectra of the Xe lamp (FIG. 11A). For power-dependent responsivity measurements, the net optical power impinging on the device was calculated using the following procedure. First, the Gaussian profile of the laser diode (515.6 nm) was confirmed by a knife-edge test on a Si photodiode coupled to a power meter. For this test, the laser spot diameter was kept to ~50 microns, and the knife-edge was kept ~1 mm away from the photodiode to minimize edge scattering. The resulting power profile was fit to an error function (integrated Gaussian function) to confirm the Gaussian profile of the laser spot. The laser spot diameter was kept at ~2 mm during the photocurrent measurement and peak power at the center was calculated from the standard properties of Gaussian beam divergence, namely power_1/power_2~(diameter_1)$^2$/(diameter_2)$^2$. Any deviation from this ideal case would decrease the net power on the device and thus the calculated net input power density represents a lower limit for responsivity and photocurrent gain.

Example 14

More generally, this invention is useful in conjunction with a wide range of bulk layered materials which are exfoliatable into corresponding few-layer nanomaterials. Such bulk layered materials include but are not limited to transition metal dichalcogenides, Group III monochalcogenides, Group IV monochalcogenides, hexagonal boron nitride, graphene and black phosphorus. In particular, few-layer nanosheets of such mono- and dichalcogenides are prepared in accordance with procedures and techniques of the sort described herein. While certain, non-limiting co-solvent systems are described herein, it will be understood by those skilled in the art made aware of this invention that such co-solvent systems and/or solvent ratios are functionally limited only by a combined surface energy sufficient to at least partially or effectively disperse exfoliated few-layer nanosheets of such material. Such co-solvent systems include but are not limited to those comprising water and one or more low-boiling point solvents miscible with water, such solvent(s) including but not limited to methanol, ethanol, acetone, isopropyl alcohol and combinations thereof.

Example 15

Demonstrating the broader applicability of this invention, a deoxygenated co-solvent system was effectively used with the layered materials black phosphorus (BP), MoS$_2$, WS$_2$, and WSe$_2$. To illustrate the superior electrical performance of corresponding thin-film devices, control thin-films were processed using traditional LPE methods of the prior art, namely aqueous surfactant (sodium dodecylsulfate, SDS) solutions. All thin-films were formed via vacuum filtration on anodic aluminum oxide membranes. Charge transport characteristics were measured for all samples under identical vacuum conditions (~5×10$^{-5}$ Torr). FIGS. 20A-D show that thin-films processed via an ethanol-water co-solvent system of this invention, in accordance with the procedures of Examples 1-2, possess up to ~3 orders of magnitude higher conductivity than comparable SDS-water processed thin films. As discussed above, these results demonstrate a significant advantage of such a co-solvent procedure in minimizing residual contaminants (e.g., the substantial absence of a surfactant) in a manner that can be generalized to provide a range of layered nanomaterials having improved performance properties.

We claim:

1. A composition, comprising:
a layered nanomaterial comprising at least one of mono-, bi- and n-layer nanosheets of said nanomaterial, where n is an integer selected from 3 to 6; and
a deoxygenated medium comprising ethanol and water, wherein said nanomaterial is selected from Group III monochalcogenides and Group IV monochalcogenides.

2. The composition of claim 1, being absent of a surfactant.

3. A composition, comprising:
a layered nanomaterial comprising at least one of mono-, bi- and n-layer nanosheets of said nanomaterial, where n is an integer selected from 3 to 6; and
a deoxygenated medium comprising ethanol and water, wherein said nanomaterial is indium selenide.

4. The composition of claim 3, wherein said deoxygenated medium is 60:40 (v/v) ethanol:water.

5. The composition of claim 1, wherein said deoxygenated medium is 60:40 (v/v) ethanol:water.

6. The composition of claim 1, wherein said deoxygenated medium comprises an Ar-purged co-solvent mixture of ethanol and water.

7. A composition, comprising:
a layered nanomaterial comprising at least one of mono-, bi- and n-layer nanosheets of said nanomaterial, where n is an integer selected from 3 to 6; and
a deoxygenated medium comprising ethanol and water, wherein said nanomaterial is selected from a transition metal dichalcogenide, hexagonal boron nitride, graphene, and black phosphorus.

8. The composition of claim 6, wherein said transition metal dichalcogenide is selected from MoS2, MoSe2, MoTe2, WS2 and WSe2.

* * * * *